(12) United States Patent
Kamiya et al.

(10) Patent No.: US 12,074,055 B2
(45) Date of Patent: Aug. 27, 2024

(54) SUBSTRATE TREATMENT DEVICE

(71) Applicant: SHIBAURA MECHATRONICS CORPORATION, Yokohama (JP)

(72) Inventors: Masaya Kamiya, Yokohama (JP); Kensuke Demura, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 382 days.

(21) Appl. No.: 17/665,657

(22) Filed: Feb. 7, 2022

(65) Prior Publication Data

US 2022/0270914 A1 Aug. 25, 2022

(30) Foreign Application Priority Data

Feb. 25, 2021 (JP) ................................. 2021-028248
Jan. 7, 2022 (JP) ................................. 2022-001464

(51) Int. Cl.
*H01L 21/687* (2006.01)
*H01L 21/67* (2006.01)

(52) U.S. Cl.
CPC .. *H01L 21/68764* (2013.01); *H01L 21/67051* (2013.01); *H01L 21/67248* (2013.01)

(58) Field of Classification Search
CPC ............................................... H01L 21/68764
See application file for complete search history.

(56) References Cited

U.S. PATENT DOCUMENTS

| | | | |
|---|---|---|---|
| 2014/0174362 A1 | 6/2014 | Kao et al. | |
| 2016/0376699 A1 | 12/2016 | Sasaki et al. | |
| 2018/0047559 A1 | 2/2018 | Kamiya et al. | |
| 2018/0114690 A1 | 4/2018 | Nishikawa et al. | |

FOREIGN PATENT DOCUMENTS

| | | |
|---|---|---|
| JP | 2003-297788 A | 10/2003 |
| JP | 2018-026436 A | 2/2018 |

*Primary Examiner* — Jason Y Ko
(74) *Attorney, Agent, or Firm* — PEARNE & GORDON LLP

(57) ABSTRACT

A substrate treatment device according to an embodiment includes a placement part that includes a placement platform on which a substrate is placeable and that is configured to rotate the placed substrate, a cooling nozzle configured to supply a cooling gas to a space between the placement platform and the substrate, a liquid supplier configured to supply a liquid to a surface of the substrate opposite to the placement platform side, and a dispersion plate located at a discharge side of the cooling gas of the cooling nozzle. The dispersion plate includes a first hole extending through the dispersion plate in a thickness direction. The first hole is located at a position overlapping a central axis of the cooling nozzle when viewed along a direction along the central axis of the cooling nozzle.

20 Claims, 11 Drawing Sheets

SUBSTRATE TREATMENT DEVICE

CROSS-REFERENCE TO RELATED APPLICATIONS

This application is based upon and claims the benefit of priority from the Japanese Patent Application No. 2021-028248, filed on Feb. 25, 2021, and Japanese Patent Application No. 2022-001464, filed on Jan. 7, 2022; the entire contents of which are incorporated herein by reference.

FIELD

Embodiments described herein relate generally to a substrate treatment device.

BACKGROUND

Freeze cleaning has been proposed to remove contaminants such as particles and the like from the surface of a substrate such as an imprint template, a photolithography mask, a semiconductor wafer, etc.

When, for example, purified water is used as the cleaning liquid of freeze cleaning, first, the purified water and a cooling gas are supplied to the surface of a rotating substrate. Then, the supply of the purified water is stopped, and a water film is formed on the surface of the substrate while discharging a portion of the supplied purified water. The water film is frozen by the cooling gas supplied to the substrate. When the water film freezes to form an ice film, contaminants such as particles and the like are detached from the surface of the substrate by being incorporated into the ice film. Then, the ice film is melted by supplying purified water to the ice film; and the contaminants are removed from the surface of the substrate together with the purified water.

If, however, the cooling gas is supplied to the side of the substrate on which the water film is formed, the water film starts to freeze from the front side (the side opposite to the substrate side of the water film). It is difficult for impurities attached to the surface of the substrate to be detached from the surface of the substrate if the water film starts to freeze from the front side.

Therefore, technology has been proposed in which the cooling gas is supplied to the back surface of the substrate (the surface of the substrate at the side opposite to where the water film is formed).

If, however, the cooling gas is simply supplied to the back surface of the substrate, fluctuation may occur in the temperature distribution in the surface of the substrate. Such fluctuation of the temperature distribution in the surface of the substrate makes it difficult to improve the removal rate of the contaminants.

Therefore, it is desirable to develop a substrate treatment device in which the fluctuation of the temperature distribution in the surface of the substrate can be suppressed.

DETAILED DESCRIPTION

Figure 1:
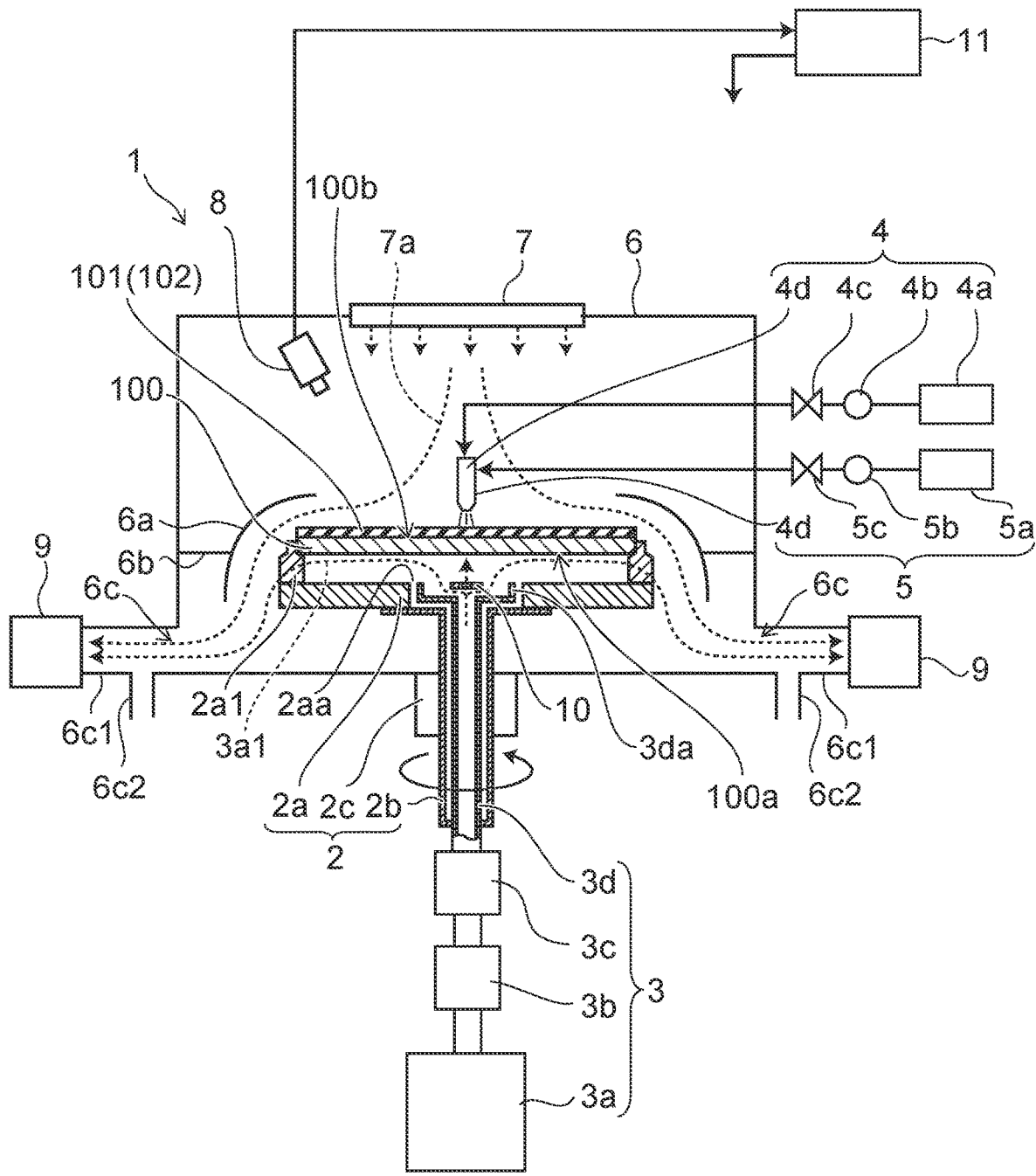
FIG. 1 is a schematic view illustrating a substrate treatment device according to an embodiment.

A substrate treatment device according to an embodiment includes a placement part that includes a placement platform on which a substrate is placeable and that is configured to rotate the placed substrate, a cooling nozzle configured to supply a cooling gas to a space between the placement platform and the substrate, a liquid supplier configured to supply a liquid to a surface of the substrate opposite to the placement platform side, and a dispersion plate located at a discharge side of the cooling gas of the cooling nozzle. The dispersion plate includes a first hole extending through the dispersion plate in a thickness direction. The first hole is located at a position overlapping a central axis of the cooling nozzle when viewed along a direction along the central axis of the cooling nozzle.

Embodiments will now be illustrated with reference to the drawings. Similar components in the drawings are marked with the same reference numerals; and a detailed description is omitted as appropriate.

A substrate 100 that is illustrated below can be, for example, a semiconductor wafer, an imprint template, a photolithography mask, a plate-shaped body used in a MEMS (Micro Electro Mechanical System), etc.

In such a case, the substrate 100 may be a substrate in which an uneven portion forms a pattern in the surface, or a substrate before an uneven portion is formed (e.g., a so-called bulk substrate).

As an example, the substrate 100 is described below as a photolithography mask. The planar shape of the substrate 100 can be substantially quadrilateral when the substrate 100 is a photolithography mask.

FIG. 1 is a schematic view illustrating a substrate treatment device 1 according to the embodiment.

As shown in FIG. 1, the substrate treatment device 1 includes a placement part 2, a cooling part 3, a first liquid supplier 4, a second liquid supplier 5, a housing 6, a blower 7, a detector 8, an exhaust part 9, a dispersion part 10, and a controller 11.

The placement part 2 includes a placement platform 2a, a rotary shaft 2b, and a driver 2c.

The placement platform 2a is configured to rotate inside the housing 6. The placement platform 2a is plate-shaped. Multiple supporters 2a1 that support the substrate 100 are located at one major surface of the placement platform 2a. When the substrate 100 is supported by the multiple supporters 2a1, a surface 100b of the substrate 100 (the surface at the side to be cleaned) faces away from the placement platform 2a side.

The edge of a back surface 100a of the substrate 100 contacts the multiple supporters 2a1. The portion of the supporter 2a1 that contacts the edge of the back surface 100a of the substrate 100 can be a tapered surface or an inclined surface. The supporter 2a1 and the edge of the back surface 100a of the substrate 100 can have point contact by setting the portion of the supporter 2a1 contacting the edge of the back surface 100a of the substrate 100 to be a tapered surface. The supporter 2a1 and the edge of the back surface 100a of the substrate 100 can have line contact by setting the portion of a supporter 2a1 contacting the edge of the back surface 100a of the substrate 100 to be an inclined surface. The occurrence of contamination, damage, etc., of the substrate 100 can be suppressed by providing point contact or line contact between the supporter 2a1 and the edge of the back surface 100a of the substrate 100.

A hole 2aa that extends through the placement platform 2a in the thickness direction is located at the central portion of the placement platform 2a.

The rotary shaft 2b is tubular. One end portion side of the rotary shaft 2b is bonded to the placement platform 2a. The other end portion side of the rotary shaft 2b is located outside the housing 6. The rotary shaft 2b is connected to the driver 2c outside the housing 6.

A cooling nozzle 3d that is described below is mounted to the end portion of the rotary shaft 2b at the side opposite to the placement platform 2a side. A not-illustrated rotary shaft seal is located between the cooling nozzle 3d and the end portion of the rotary shaft 2b at the side opposite to the placement platform 2a side. The end portion of the rotary shaft 2b at the side opposite to the placement platform 2a side is airtightly sealed thereby.

The driver 2c is located outside the housing 6. The driver 2c is connected to the rotary shaft 2b. The driver 2c can include rotating equipment such as a motor, etc. The rotational force of the driver 2c is conducted to the placement platform 2a via the rotary shaft 2b. Therefore, the placement platform 2a as well as the substrate 100 placed on the placement platform 2a can be rotated by the driver 2c.

The driver 2c not only can start and stop the rotation but also can change the rotational speed. The driver 2c can include, for example, a control motor such as a servo motor, etc.

In other words, the placement part 2 includes the placement platform 2a on which the substrate 100 is placeable, and is configured to rotate the substrate 100 that is placed.

The cooling part 3 supplies a cooling gas 3a1 to the space between the placement platform 2a and the back surface 100a of the substrate 100. The cooling part 3 includes a cooling liquid part 3a, a filter 3b, a flow rate controller 3c, and the cooling nozzle 3d. The cooling liquid part 3a, the filter 3b, and the flow rate controller 3c are located outside the housing 6.

The cooling liquid part 3a stores a cooling liquid and generates the cooling gas 3a1. The cooling liquid is the liquefied cooling gas 3a1. The cooling gas 3a1 is not particularly limited as long as the cooling gas 3a1 is a gas that does not easily react with the material of the substrate 100. The cooling gas 3a1 can be, for example, an inert gas such as nitrogen gas, helium gas, argon gas, etc.

In such a case, the cooling time of the substrate 100 can be reduced by using a gas having a high specific heat. For example, the cooling time of the substrate 100 can be reduced by using helium gas. Also, the processing cost of the substrate 100 can be reduced by using nitrogen gas.

The cooling liquid part 3a includes a tank that stores the cooling liquid, and a vaporizer that vaporizes the cooling liquid stored in the tank. A cooling device for maintaining the temperature of the cooling liquid is located in the tank. The vaporizer generates the cooling gas 3a1 from the cooling liquid by increasing the temperature of the cooling liquid. For example, the vaporizer can utilize the external air temperature or can use heat from a heating medium. It is sufficient for the temperature of the cooling gas 3a1 to be not more than the freezing point of a liquid 101; for example, the temperature of the cooling gas 3a1 can be $-170°$ C.

Although the cooling liquid part 3a that generates the cooling gas 3a1 by vaporizing the cooling liquid stored in the tank is illustrated, it is also possible to cool the nitrogen gas or the like with a chiller or the like to obtain the cooling gas 3a1. The cooling liquid part can be simplified thereby.

The filter 3b is connected to the cooling liquid part 3a via a pipe. The filter 3b suppresses the outflow toward the substrate 100 side of contaminants such as particles, etc., included in the cooling liquid.

The flow rate controller 3c is connected to the filter 3b via a pipe. The flow rate controller 3c controls the flow rate of the cooling gas 3a1. The flow rate controller 3c can be, for example, a MFC (Mass Flow Controller), etc. The flow rate controller 3c may indirectly control the flow rate of the cooling gas 3a1 by controlling the supply pressure of the cooling gas 3a1. In such a case, the flow rate controller 3c can be, for example, an APC (Auto Pressure Controller), etc.

The temperature of the cooling gas 3a1 generated from the cooling liquid in the cooling liquid part 3a is a substantially prescribed temperature. Therefore, the flow rate controller 3c can control the temperature of the substrate 100 as well as the temperature of the liquid 101 at the surface 100b of the substrate 100 by controlling the flow rate of the cooling gas 3a1. In such a case, the liquid 101 can be set to a supercooled state in a supercooling process described below by the flow rate controller 3c controlling the flow rate of the cooling gas 3a1.

The cooling nozzle 3d is tubular. One end portion of the cooling nozzle 3d is connected to the flow rate controller 3c. A hole 3d1 is provided along the central axis of the cooling nozzle 3d inside the cooling nozzle 3d (the hole 3d1 that corresponds to an example of a second hole and extends through the interior of the cooling nozzle 3d) (see FIG. 2B). A radially-enlarged portion 3da is located at the other end portion of the cooling nozzle 3d (the end portion at the discharge side of the cooling gas 3a1). The outer diameter of the radially-enlarged portion 3da is, for example, circular and is greater than the outer diameter of the flow rate controller 3c side of the cooling nozzle 3d. It is favorable for the exterior form of the radially-enlarged portion 3da to be smaller than the exterior form of the substrate 100.

For example, it is favorable for the exterior form of the radially-enlarged portion 3da to be smaller than the inscribed circle of the substrate 100. The radially-enlarged portion 3da is located inside the hole 2aa that is provided at the central portion of the placement platform 2a. The end surface of the radially-enlarged portion 3da can be located at the vicinity of the surface of the placement platform 2a at the substrate 100 side.

The cooling gas $3a1$ of which the flow rate is controlled by the flow rate controller $3c$ is supplied by the cooling nozzle $3d$ from the one end portion of the cooling nozzle $3d$ to the radially-enlarged portion $3da$ via the hole $3d1$. The cooling gas $3a1$ that is supplied to the radially-enlarged portion $3da$ is supplied to the space between the placement platform $2a$ and the back surface $100a$ of the substrate $100$ as well as the back surface $100a$ of the substrate $100$ after striking the dispersion part $10$.

The first liquid supplier $4$ supplies the liquid $101$ to the surface $100b$ of the substrate $100$. A pressure wave is generated in a freezing process described below by the volume change when the liquid $101$ changes into a solid. It is considered that the pressure wave detaches the contaminants attached to the surface $100b$ of the substrate $100$. Therefore, the liquid $101$ is not particularly limited as long as the liquid $101$ does not easily react with the material of the substrate $100$. The liquid $101$ in the supercooled state is such that a density change due to a temperature nonuniformity of the liquid film, the existence of a contaminant such as a particle or the like, a vibration, etc., may be a starting point of the freezing. That is, there are also cases where a contaminant is the starting point of the freezing.

If the liquid $101$ is a liquid whose volume increases when it is frozen, it is considered that the contaminants adhering to the surface of the substrate $100$ can be separated by utilizing the physical force accompanying the volume increase. Therefore, it is favorable for the liquid $101$ to be a liquid that does not easily react with the material of the substrate $100$ and of which the volume increases when freezing. For example, the liquid $101$ can be water (e.g., purified water, ultrapure water, etc.), a liquid that includes water as a major component, etc. Liquids that include water as a major component can be, for example, a mixed liquid of water and alcohol, a mixed liquid of water and an acid solution, a mixed liquid of water and an alkaline solution, etc.

A gas can be dissolved in the liquid $101$. Gases can include, for example, carbon dioxide gas, ozone gas, hydrogen gas, etc.

The first liquid supplier $4$ includes, for example, a liquid container $4a$, a supplier $4b$, a flow rate controller $4c$, and a liquid nozzle $4d$. The liquid container $4a$, the supplier $4b$, and the flow rate controller $4c$ are located outside the housing $6$.

The liquid container $4a$ stores the liquid $101$ described above. The liquid $101$ is stored in the liquid container $4a$ at a temperature that is greater than the freezing point. The temperature of the liquid $101$ is, for example, room temperature (20° C.).

The supplier $4b$ is connected to the liquid container $4a$ via a pipe. The supplier $4b$ supplies the liquid $101$ stored in the liquid container $4a$ toward the liquid nozzle $4d$. The supplier $4b$ is, for example, a pump or the like that is resistant to the liquid $101$.

The flow rate controller $4c$ is connected to the supplier $4b$ via a pipe. The flow rate controller $4c$ controls the flow rate of the liquid $101$ supplied by the supplier $4b$. The flow rate controller $4c$ can be, for example, a flow rate control valve. The flow rate controller $4c$ can start and stop the supply of the liquid $101$.

The liquid nozzle $4d$ is located inside the housing $6$. The liquid nozzle $4d$ is tubular. One end portion of the liquid nozzle $4d$ is connected to the flow rate controller $4c$ via a pipe. The other end portion of the liquid nozzle $4d$ faces the surface $100b$ of the substrate $100$ placed on the placement platform $2a$.

Therefore, the liquid $101$ that is discharged from the liquid nozzle $4d$ is supplied to the surface $100b$ of the substrate $100$.

The other end portion of the liquid nozzle $4d$ (the discharge port of the liquid $101$) is positioned at substantially the center of the surface $100b$ of the substrate $100$. The liquid $101$ that is discharged from the liquid nozzle $4d$ spreads from substantially the center of the surface $100b$ of the substrate $100$ and forms a liquid film of a substantially constant thickness on the surface $100b$ of the substrate $100$. The film of the liquid $101$ formed at the surface $100b$ of the substrate $100$ is called a liquid film hereinbelow.

The second liquid supplier $5$ supplies a liquid $102$ to the surface $100b$ of the substrate $100$.

The second liquid supplier $5$ includes a liquid container $5a$, a supplier $5b$, a flow rate controller $5c$, and the liquid nozzle $4d$.

The liquid $102$ can be used in a thawing process that is described below. Therefore, the liquid $102$ is not particularly limited as long as the liquid $102$ does not easily react with the material of the substrate $100$ and the liquid $102$ does not easily remain at the surface $100b$ of the substrate $100$ in a drying process that is described below. The liquid $102$ can be, for example, water (e.g., purified water, ultrapure water, etc.), a mixed liquid of water and alcohol, etc.

The liquid container $5a$ can be similar to the liquid container $4a$ described above. The supplier $5b$ can be similar to the supplier $4b$ described above. The flow rate controller $5c$ can be similar to the flow rate controller $4c$ described above.

The second liquid supplier $5$ can be omitted when the liquids $102$ and $101$ are the same. Although the liquid nozzle $4d$ is illustrated as being used for both the liquids $102$ and $101$, the liquid nozzle that discharges the liquid $101$ and the liquid nozzle that discharges the liquid $102$ can be included separately.

The temperature of the liquid $102$ can be greater than the freezing point of the liquid $101$. The temperature of the liquid $102$ can be a temperature at which the frozen liquid $101$ can be thawed. The temperature of the liquid $102$ can be, for example, about room temperature (20° C.).

When the second liquid supplier $5$ is omitted, the first liquid supplier $4$ is used in the thawing process. That is, the liquid $101$ is used. The temperature of the liquid $101$ can be a temperature at which the frozen liquid $101$ can be thawed. The temperature of the liquid $101$ can be, for example, about room temperature (20° C.).

The housing $6$ is box-shaped. A cover $6a$ is located inside the housing $6$. The liquids $101$ and $102$ that are supplied to the substrate $100$ and are discharged outward from the substrate $100$ by the rotation of the substrate $100$ are caught by the cover $6a$. The cover $6a$ is tubular. The cover $6a$ is bent toward the center of the cover $6a$ at the vicinity of the end portion at the side opposite to the placement platform $2a$ side (the upper end vicinity of the cover $6a$). Therefore, the liquids $101$ and $102$ that scatter upward from the substrate $100$ can be easily caught.

A divider $6b$ also is located inside the housing $6$. The divider $6b$ is located between the outer surface of the cover $6a$ and the inner surface of the housing $6$.

Multiple outlets $6c$ are provided in the side surface of the housing $6$ at the bottom surface side. The housing $6$ illustrated in FIG. 1 includes two outlets $6c$. The used cooling gas $3a1$, air $7a$, liquid $101$, and liquid $102$ are discharged out of the housing $6$ through the outlet $6c$. An exhaust pipe $6c1$ is connected to the outlet $6c$; and the exhaust part $9$ (e.g., a pump) that exhausts the used cooling gas $3a1$ and air $7a$ is connected to the exhaust pipe 6c1. A discharge pipe 6c2 that discharges the liquids 101 and 102 also is connected to the outlet 6c.

The outlet 6c is lower than the substrate 100. Therefore, the cooling gas 3a1 that is exhausted from the outlet 6c creates a downflow. As a result, particles can be prevented from floating around.

The blower 7 is located at the ceiling surface of the housing 6. The blower 7 can include a filter and a circulator such as a fan, etc. The filter can be, for example, a HEPA filter (High Efficiency Particulate Air Filter), etc.

The blower 7 supplies the air 7a (the external air) to the space between the divider 6b and the ceiling of the housing 6. Therefore, the pressure of the space between the divider 6b and the ceiling of the housing 6 is greater than the external pressure. As a result, the air 7a that is supplied by the blower 7 is easily guided to the outlet 6c. Also, the penetration of contaminants such as particles, etc., into the housing 6 through the outlet 6c can be suppressed.

The detector 8 is located in the space between the divider 6b and the ceiling of the housing 6. The detector 8 detects the temperature of the liquid film and/or the frozen film of the liquid 101. In such a case, the detector 8 can be, for example, a radiation thermometer, a thermo-viewer, a thermocouple, or a resistance thermometer bulb. The detector 8 may detect the thickness of the liquid film and/or the surface position of the frozen film. In such a case, the detector 8 can be, for example, a laser displacement meter, an ultrasonic displacement meter, etc. The detector 8 may include an image sensor or the like that detects the surface state of the liquid film and/or the surface state of the frozen film.

The temperature, the thickness, and the surface state of the liquid film that are detected can be used to control the supercooled state of the liquid 101 in the supercooling process described below. Note that controlling the supercooled state means controlling the curve of the temperature change of the liquid 101 in the supercooled state so that the liquid 101 is not frozen due to rapid cooling, that is, the supercooled state is maintained.

There are cases where fluctuation of the temperature distribution in the surface of the substrate 100 occurs when the cooling gas 3a1 is simply supplied to the back surface 100a of the substrate 100. For example, when the thermal conductivity of the substrate 100 is low, etc., the temperature of the region of the substrate 100 onto which the cooling gas 3a1 is blown becomes low, but the temperatures of the regions separated from this region exceed the temperature of this region. When fluctuation of the temperature distribution in the surface of the substrate 100 occurs, the removal rate of the contaminants between the regions of the substrate 100 fluctuates in the cooling process (supercooling process+ freezing process) described below, and it may be difficult to improve the removal rate of the contaminants in the entire region of the substrate 100.

Therefore, the dispersion part 10 is included in the substrate treatment device 1 according to the embodiment.

As shown in FIG. 1, the dispersion part 10 (a dispersion plate 10a) is located at the discharge side of the cooling gas 3a1 of the cooling nozzle 3d.

Figure 2A:
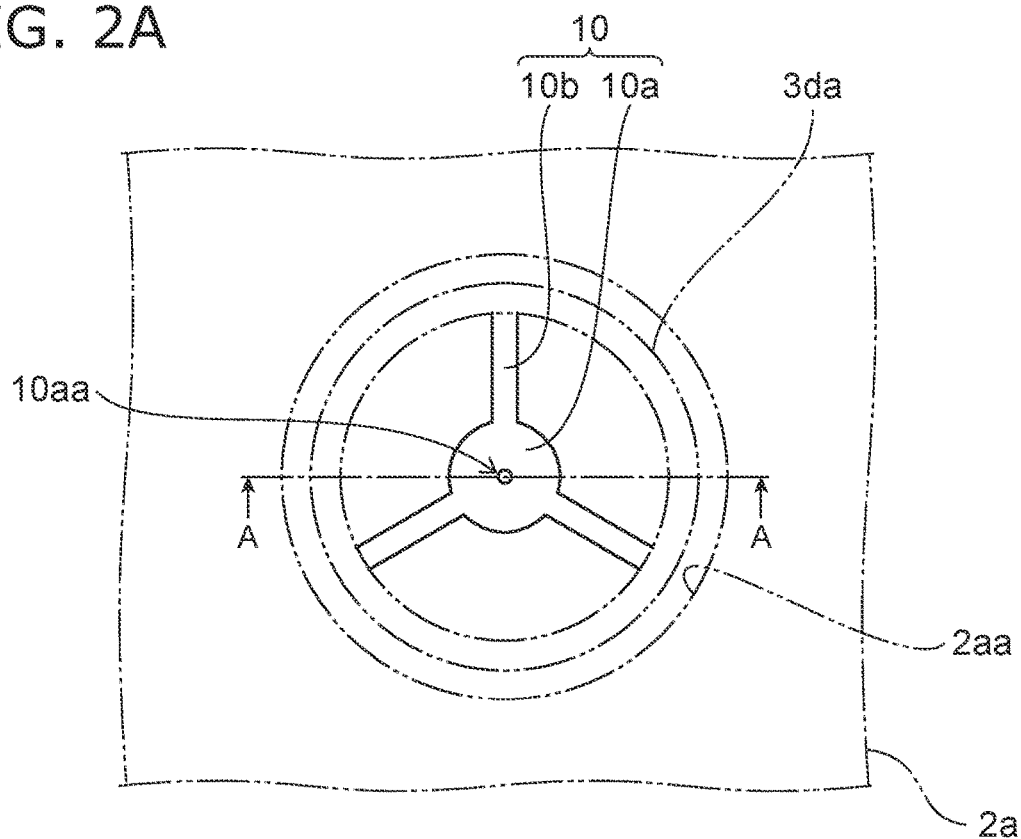
FIG. 2A is a schematic plan view illustrating a dispersion part.

FIG. 2A is a schematic plan view illustrating the dispersion part 10.

Figure 2B:
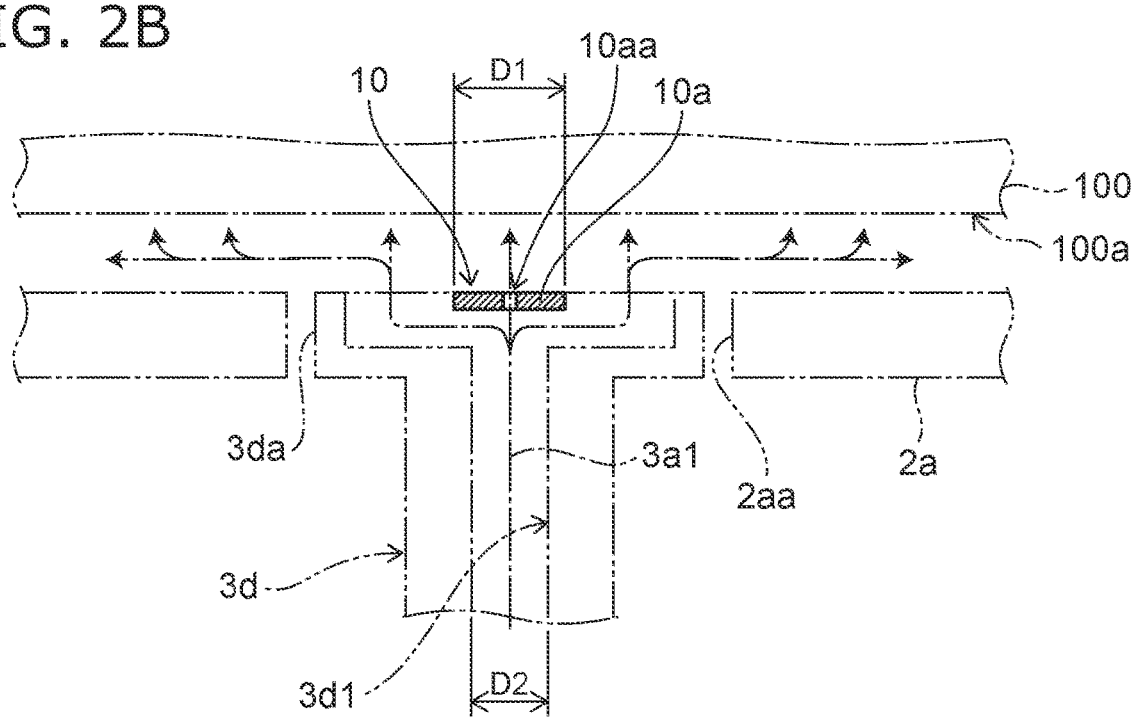
FIG. 2B is a line A-A cross-sectional view of the dispersion part of FIG. 2A.

FIG. 2B is a line A-A cross-sectional view of the dispersion part 10 of FIG. 2A.

As shown in FIGS. 2A and 2B, the dispersion part 10 includes, for example, the dispersion plate 10a and a supporter 10b. The dispersion plate 10a and the supporter 10b can be formed to have a continuous body.

The dispersion plate 10a is plate-shaped. It is favorable for the thickness of the dispersion plate 10a to be less than the thickness of the substrate 100. However, as described below, the dispersion plate 10a is cooled by the cooling gas 3a1. Therefore, it is favorable for the thickness of the dispersion plate 10a to be able to withstand thermal expansion. For example, a thickness that can withstand thermal expansion is 2 mm. It is favorable for the dispersion plate 10a to include a material that has good thermal conductivity such as a metal, etc.

The dispersion plate 10a is located inside the radially-enlarged portion 3da of the cooling nozzle 3d. The dispersion plate 10a can be located at the vicinity of the opening of the radially-enlarged portion 3da. Specifically, the surface of the placement platform 2a at the substrate 100 side and the surface of the dispersion plate 10a at the substrate 100 side are located at the same level (the same position) in the direction along the central axis of the cooling nozzle 3d. That is, the distance between the surface of the placement platform 2a at the substrate 100 side and the back surface 100a of the substrate 100 supported by the supporter 2a1 and the distance between the surface of the dispersion plate 10a at the substrate 100 side and the back surface 100a of the substrate 100 supported by the supporter 2a1 are the same.

The central axis of the dispersion plate 10a can be located at a position that overlaps the central axis of the cooling nozzle 3d. In other words, the dispersion plate 10a can be located directly above the hole 3d1 of the cooling nozzle 3d. The surface of the dispersion plate 10a can be orthogonal to the central axis of the cooling nozzle 3d.

The planar shape of the dispersion plate 10a of the embodiment is circular. However, the planar shape of the dispersion plate 10a is not limited thereto. For example, the planar shape of the dispersion plate 10a can be a regular polygon that has an even number of corners and can be considered to be a circle, etc. As described below, a portion of the cooling gas 3a1 that strikes the dispersion plate 10a flows through the interior of the radially-enlarged portion 3da and is discharged through the opening of the radially-enlarged portion 3da. Therefore, if the planar shape of the dispersion plate 10a is circular, the dimension between the dispersion plate 10a and the inner wall of the radially-enlarged portion 3da and the flow path resistance can be substantially constant. Accordingly, a bias of the flow velocity and/or the flow rate of the cooling gas 3a1 discharged through the opening of the radially-enlarged portion 3da can be suppressed.

The dispersion plate 10a includes a hole 10aa (corresponding to an example of a first hole) that extends through the dispersion plate 10a in the thickness direction. The hole 10aa is located at a position that overlaps the central axis of the cooling nozzle 3d when viewed along a direction along the central axis of the cooling nozzle 3d. For example, the hole 10aa is located at the central portion of the dispersion plate 10a.

The supporter 10b supports the dispersion plate 10a so that the dispersion plate 10a is at a prescribed position inside the radially-enlarged portion 3da of the cooling nozzle 3d. The supporter 10b has a beam-like shape and is located between the side surface of the dispersion plate 10a and the inner wall of the radially-enlarged portion 3da of the cooling nozzle 3d. For example, the thickness of the supporter 10b can be equal to the thickness of the dispersion plate 10a. It is sufficient for at least one supporter 10b to be included. However, the position and the orientation of the dispersion plate 10a can be stabilized by including multiple supporters 10b.

As shown in FIG. 2B, the flow direction of the cooling gas 3a1 that flows through the interior of the hole 3d1 of the cooling nozzle 3d is changed by the cooling gas 3a1 striking the dispersion plate 10a. At this time, a portion of the cooling gas 3a1 striking the dispersion plate 10a is supplied to the back surface 100a of the substrate 100 via the hole 10aa of the dispersion plate 10a. The cooling gas 3a1 of which the flow direction is changed by the dispersion plate 10a flows through the interior of the radially-enlarged portion 3da and is discharged through the opening of the radially-enlarged portion 3da. Also, a portion of the cooling gas 3a1 can be caused to remain inside the radially-enlarged portion 3da.

After striking the dispersion part 10, the cooling gas 3a1 that is discharged through the opening of the radially-enlarged portion 3da flows through the space between the placement platform 2a and the back surface 100a of the substrate 100 and is supplied to the back surface 100a of the substrate 100.

By including the dispersion part 10 (the dispersion plate 10a), the cooling gas 3a1 can strike the central portion of the substrate less directly than when the cooling gas 3a1 is directly supplied from the cooling nozzle 3d to the back surface 100a of the substrate 100. Therefore, the central portion of the back surface 100a of the substrate 100 can be prevented from being over-cooled compared to the outer perimeter of the substrate 100. Also, the temperature of the cooling gas 3a1 can be maintained in a lower state by causing the cooling gas 3a1 to strike the dispersion part 10 than by directly supplying the cooling gas 3a1 to the back surface 100a of the substrate 100 (details are described below). Therefore, the cooling gas 3a1 can be supplied to wider region while maintaining a lower temperature of the cooling gas 3a1 than when the cooling gas 3a1 is directly supplied to the back surface 100a of the substrate 100. Accordingly, the fluctuation of the temperature distribution in the surface of the substrate 100 can be suppressed. As a result, the removal rate of the contaminants in the entire region of the substrate 100 can be improved because the fluctuation of the removal rate of the contaminants between the regions of the substrate 100 in the cooling process (supercooling process+freezing process) described below can be suppressed.

The fluctuation of the temperature distribution in the surface of the substrate 100 can be adjusted using a planar dimension D1 of the dispersion plate 10a and/or the cross-sectional dimension (e.g., the diameter) of the hole 10aa.

According to knowledge obtained by the inventor, it is favorable for the planar dimension D1 of the dispersion plate 10a to be equal to or slightly greater than a cross-sectional dimension D2 (e.g., the diameter) of the hole 3d1 of the cooling nozzle 3d. For example, the planar dimension D1 of the dispersion plate 10a can be about 1 mm to 3 mm greater than the cross-sectional dimension D2 of the hole 3d1.

The cross-sectional dimension of the hole 10aa is less than the cross-sectional dimension D2 of the hole 3d1. It is favorable for the cross-sectional dimension of the hole 10aa to be not less than 1 mm and not more than 2.5 mm.

The fluctuation of the temperature distribution in the surface of the substrate 100 is easily suppressed by thus setting the planar dimension D1 of the dispersion plate 10a and the cross-sectional dimension of the hole 10aa. Therefore, the removal rate of the contaminants can be further improved.

The controller 11 controls the operations of the components included in the substrate treatment device 1. The controller 11 includes, for example, a calculator such as a CPU (Central Processing Unit) or the like, memory such as semiconductor memory, etc. The controller 11 is, for example, a computer. The memory can store a control program that controls the operations of the components included in the substrate treatment device 1. The calculator uses the control program stored in the memory, data input by an operator, data from the detector 8, etc., to control the operations of the components included in the substrate treatment device 1.

For example, the cooling rate of the liquid 101 has a correlation with the thickness of the liquid film. For example, the cooling rate of the liquid 101 increases as the thickness of the liquid film decreases. Conversely, the cooling rate of the liquid 101 decreases as the thickness of the liquid film increases. Therefore, the controller 11 can control the flow rate of the cooling gas 3a1 as well as the cooling rate of the liquid 101 based on the thickness of the liquid 101 (the thickness of the liquid film) detected by the detector 8. The control of the temperature and/or the cooling rate of the liquid 101 is performed when controlling the supercooled state of the liquid 101 in the supercooling process described below. Therefore, for example, the controller 11 can control the rotation of the substrate 100, the flow rate of the cooling gas 3a1, and the supply amount of the liquid 101.

Operations of the substrate treatment device 1 will now be illustrated.

Figure 3:
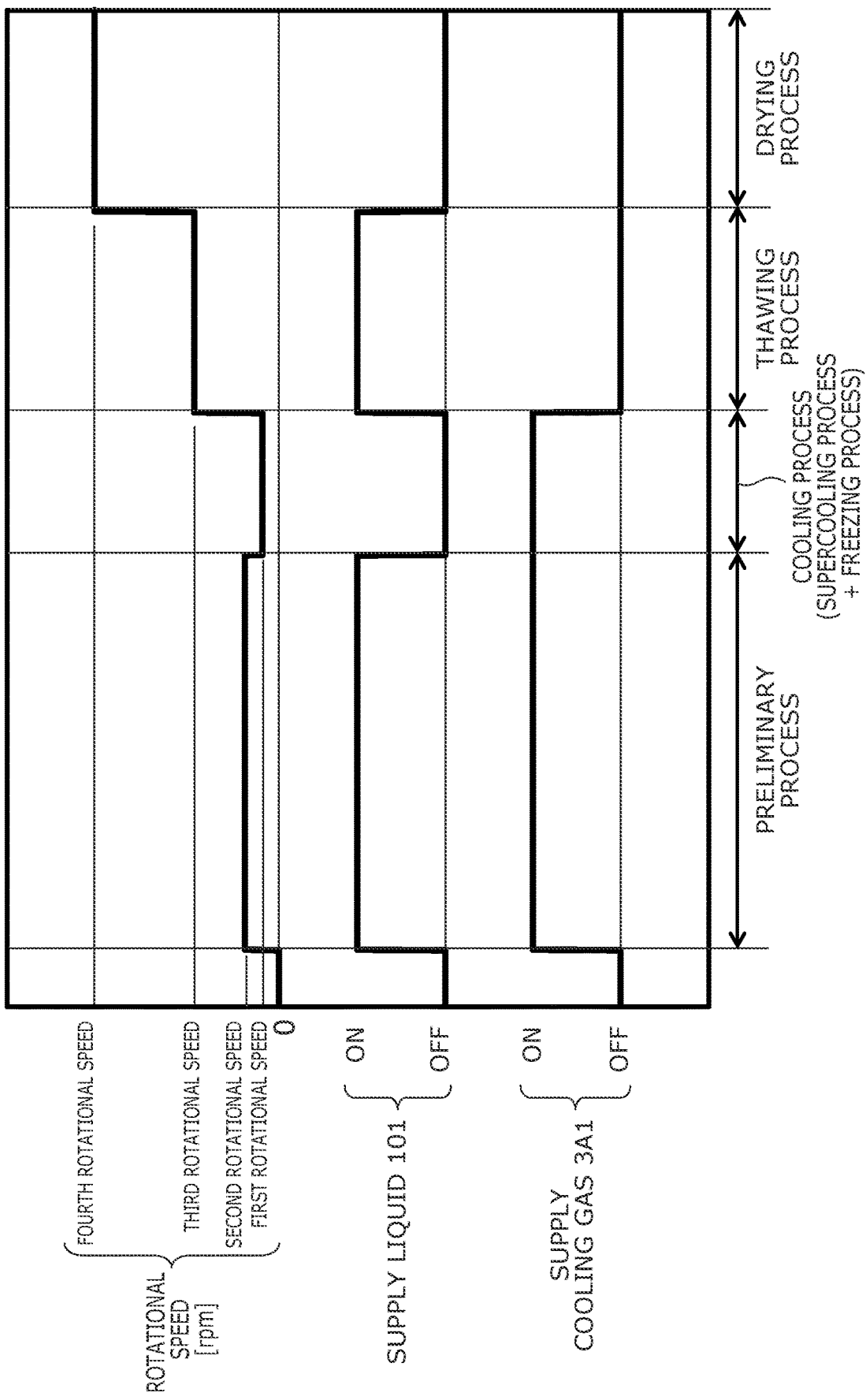
FIG. 3 is a timing chart for illustrating the operations of the substrate treatment device.

FIG. 3 is a timing chart for illustrating the operations of the substrate treatment device 1.

In FIG. 3, the substrate 100 is a 6025 quartz (Qz) substrate (152 mm×152 mm×6.35 mm); and the liquid 101 is purified water.

First, the substrate 100 is transferred into the housing 6 via a not-illustrated carry-in/carry-out port of the housing 6.

The substrate 100 is placed on and supported by the multiple supporters 2a1 of the placement platform 2a.

After the substrate 100 is supported by the placement platform 2a, a freeze cleaning process that includes a preliminary process, a cooling process (supercooling process+freezing process), a thawing process, and a drying process is performed as shown in FIG. 3.

First, the preliminary process is performed as shown in FIG. 3. In the preliminary process, the controller 11 controls the supplier 4b and the flow rate controller 4c to supply the liquid 101 at a prescribed flow rate to the surface 100b of the substrate 100. The controller 11 controls the flow rate controller 3c to supply the cooling gas 3a1 at a prescribed flow rate to the back surface 100a of the substrate 100. The controller 11 controls the driver 2c to rotate the substrate 100 at a second rotational speed.

Therefore, the liquid 101 is supplied at a prescribed flow rate to the rotating substrate 100.

For example, the second rotational speed is about 50 rpm to 500 rpm. For example, the flow rate of the liquid 101 is about 0.1 L/min to 1 L/min. For example, the flow rate of the cooling gas 3a1 is about 40 NL/min to 200 NL/min. For example, the process time of the preliminary process is about 1800 seconds. The process time of the preliminary process may be any time as long as the in-plane temperature of the substrate 100 becomes substantially uniform, and can be obtained by conducting experiments or simulations in advance.

Because the liquid 101 is supplied at the prescribed flow rate, the temperature of the liquid film in the preliminary process is substantially equal to the temperature of the liquid 101 that is supplied. For example, the temperature of the liquid film is about room temperature (20° C.) when the temperature of the liquid 101 that is supplied is about room temperature (20° C.).

Then, the cooling process (supercooling process+freezing process) is performed as shown in FIG. 3. According to the embodiment, within the cooling process, the process from when the liquid 101 reaches the supercooled state until freezing starts is called the "supercooling process"; and the process from the freezing of the liquid 101 in the supercooled state to the start of thawing by the thawing process is called the "freezing process".

Here, the liquid 101 undesirably freezes quickly without reaching the supercooled state if the cooling rate of the liquid 101 is too fast. Therefore, the controller 11 controls at least one of the flow rate of the cooling gas 3a1 or the rotational speed of the substrate 100 so that the liquid 101 at the surface 100b of the substrate 100 reaches the supercooled state.

In the cooling process (supercooling process+freezing process) as illustrated in FIG. 3, the supply of the liquid 101 of the preliminary process is stopped after setting the rotational speed to a first rotational speed. For example, the first rotational speed is about 0 rpm to 50 rpm. The first rotational speed is such that the liquid 101 that is supplied from the supplier 4b spreads over the surface 100b of the substrate 100, a liquid film is formed to have a uniform thickness, and the uniform thickness of the liquid film is maintained. That is, the controller 11 rotates the substrate 100 at a rotational speed that is less than the rotational speed of the preliminary process. The thickness of the liquid film of the liquid 101 at this time can be not less than the height dimension of the uneven portion provided in the surface 100b of the substrate 100. Supercooling may be difficult when the thickness of the liquid film is thin. In such a case, it is favorable for the thickness of the liquid film to be not less than about 100 μm. It is favorable to appropriately determine the specific conditions of the rotational speed by performing experiments and/or simulations. The same flow rate of the cooling gas 3a1 as the preliminary process is maintained.

Thus, in the cooling process (supercooling process+freezing process), the supply of the liquid 101 is stopped and the rotational speed of the substrate 100 is set to the first rotational speed that is less than the second rotational speed so that the liquid 101 that exists on the substrate 100 remains. Therefore, the cooling gas 3a1 that is continuously supplied to the back surface 100a of the substrate 100 reduces the temperature of the liquid film on the substrate 100 to be less than the temperature of the liquid film of the preliminary process; and the liquid film on the substrate 100 reach a supercooled state.

The preliminary process may be performed at the first rotational speed, and the supply of the liquid 101 may be stopped when the in-plane temperature of the substrate 100 becomes uniform.

The conditions of the liquid 101 reaching the supercooled state are affected by the size of the substrate 100, the viscosity of the liquid 101, the specific heat of the cooling gas 3a1, etc. Therefore, it is favorable to appropriately determine the control conditions for the liquid 101 reaching the supercooled state by performing experiments and/or simulations.

In the supercooled state, for example, the freezing of the liquid 101 is started by the temperature of the liquid film, the existence of bubbles, contaminants such as particles, vibrations, etc. For example, in the case of contaminants such as particles, etc., the freezing of the liquid 101 starts when the temperature of the liquid 101 is not less than −35° C. and not more than −20° C. Also, the freezing of the liquid 101 can be started by applying a vibration to the liquid 101 by causing the rotation of the substrate 100 to fluctuate, etc.

When the freezing of the liquid 101 in the supercooled state starts, the supercooling process transitions to the freezing process. In the freezing process, the liquid 101 and the frozen liquid 101 exist at the surface 100b of the substrate 100. Even in the freezing process, the cooling gas 3a1 continues to be supplied to the back surface 100a of the substrate 100. Therefore, the liquid 101 that has been supercooled on the surface 100b of the substrate 100 is in a state where the liquid 101 and the frozen liquid are mixed, and then completely freezes to form a frozen film.

The conditions of freezing the liquid 101 in the supercooled state are not limited to those illustrated. For example, the flow rate of the cooling gas 3a1 may be increased. Also, the liquid 101 may be frozen by applying a vibration to the liquid 101 in the supercooled state, etc. For example, the rotational speed of the substrate 100 may be changed, or the ultrasonic generator that applies vibrations to the liquid 101 on the substrate 100 indirectly or directly via the rotary shaft 2b, etc., may be included.

Then, the thawing process is performed as shown in FIG. 3. In FIG. 3, the liquid 101 and the liquid 102 are the same liquid. Therefore, the liquid 101 is recited in FIG. 3. In the thawing process, the controller 11 controls the supplier 4b and the flow rate controller 4c to supply the liquid 101 at the prescribed flow rate to the surface 100b of the substrate 100. When the liquid 101 and the liquid 102 are different, the controller 11 controls the supplier 5b and the flow rate controller 5c to supply the liquid 102 at the prescribed flow rate to the surface 100b of the substrate 100.

Also, the controller 11 controls the flow rate controller 3c to stop the supply of the cooling gas 3a1. The controller 11 controls the driver 2c to increase the rotational speed of the substrate 100 to a third rotational speed. The third rotational speed is, for example, about 200 rpm to 700 rpm. As the rotation of the substrate 100 increases, the liquid 101 and the frozen liquid 101 can be flung off by the centrifugal force. Therefore, the liquid 101 and the frozen liquid 101 can be discharged from the surface 100b of the substrate 100. At this time, the contaminants that are detached from the surface 100b of the substrate 100 also are discharged together with the liquid 101 and the frozen liquid 101.

The supply amount of the liquid 101 or the liquid 102 is not particularly limited as long as thawing is possible. The third rotational speed of the substrate 100 is not particularly limited as long as the liquid 101, the frozen liquid 101, and the contaminants can be discharged.

It is not always necessary to start the thawing after the liquid film has frozen; for example, the thawing may be started in a state in which at least a portion of the liquid 101 in the supercooled state is frozen.

Then, the drying process is performed as shown in FIG. 3. In the drying process, the controller 11 controls the supplier 4b and the flow rate controller 4c to stop the supply of the liquid 101. When the liquid 101 and the liquid 102 are different, the controller 11 controls the supplier 5b and the flow rate controller 5c to stop the supply of the liquid 102.

The controller 11 controls the driver 2c to increase the rotational speed of the substrate 100 to a fourth rotational speed that is faster than the third rotational speed. The drying of the substrate 100 can be faster as the rotation of the substrate 100 is increased. The fourth rotational speed of the substrate 100 is not particularly limited as long as drying is possible.

The substrate 100 for which the freeze cleaning has ended is transferred from the housing 6 via the not-illustrated carry-in/carry-out port of the housing 6.

Thus, the processing of the substrate 100 (the removal of the contaminants) can be performed.

The substrate treatment device 1 of the embodiment includes the dispersion part 10. Therefore, the effects of the dispersion part 10 (the temperature of the frozen film and the removal rate) are described below using comparative examples.

Figure 4:
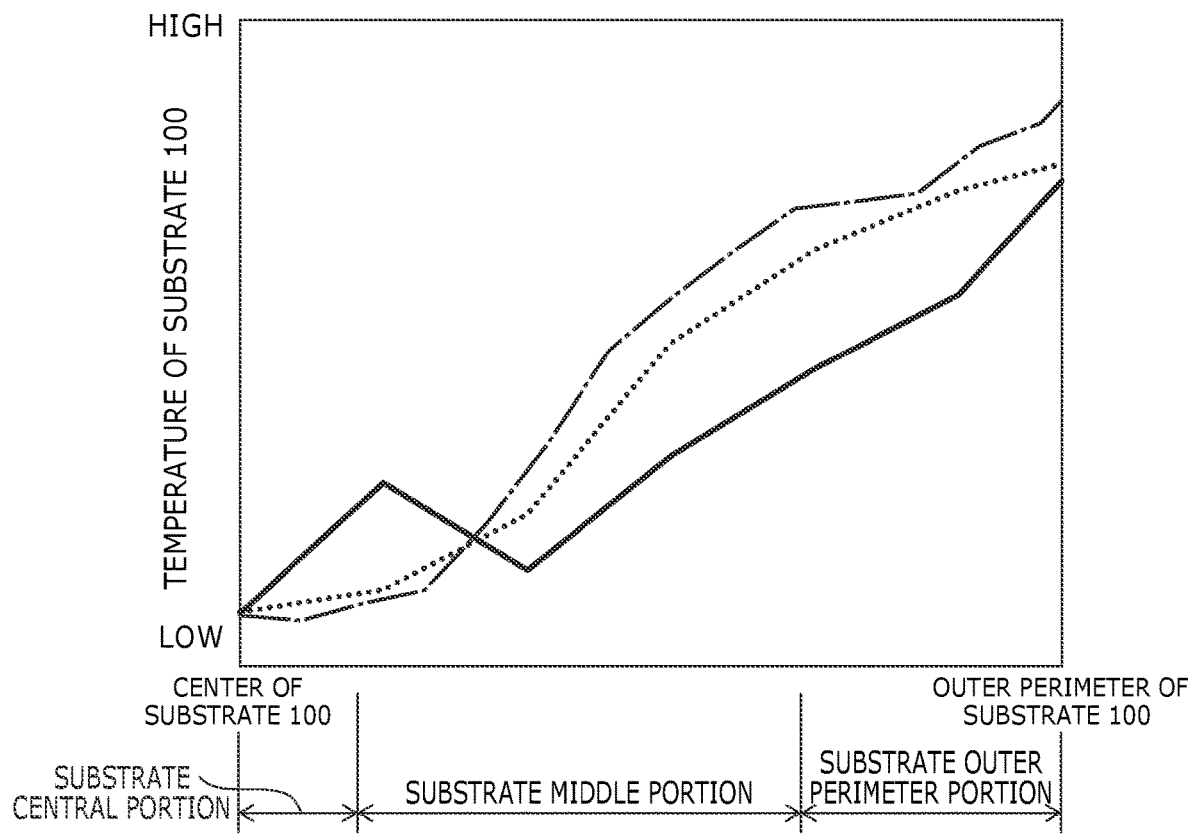
FIG. 4 shows the temperature of the frozen film from the center to the outer perimeter of a substrate directly before thawing.

FIG. 4 shows the temperature of the frozen film from the center to the outer perimeter of the substrate 100 directly before thawing.

The substrate is subdivided into a substrate central portion, a substrate middle portion, and a substrate outer perimeter portion from the center of the substrate toward the outer perimeter of the substrate. The length of the substrate central portion is substantially equal to the radius of the dispersion plate 10a. The length of the sum of the substrate central portion and the substrate middle portion is substantially equal to the radius of the radially-enlarged portion 3da of the cooling nozzle 3d.

The dotted line shows the temperature of the frozen film directly before thawing when using a cooling nozzle that includes a tip without a radially-enlarged portion. This example is called a comparative example 1.

The single dot-dash line shows the temperature of the frozen film directly before thawing when using only the cooling nozzle 3d that includes the radially-enlarged portion 3da. This example is called a comparative example 2.

The solid line shows the temperature of the frozen film directly before thawing when using the cooling nozzle 3d that includes the radially-enlarged portion 3da and the dispersion part 10 that includes the dispersion plate 10a having the hole 10aa of 2 mm. This example is called an example 1.

The example 1 and the comparative example 1 are compared. In the substrate central portion as shown in FIG. 4, the temperature of the frozen film directly before thawing is higher for the example 1 than for the comparative example 1. However, at the substrate middle portion and the substrate outer perimeter portion, the temperature of the frozen film directly before thawing is lower for the example 1 than for the comparative example 1. The temperature of the frozen film on the central region of the substrate 100 in the example 1 is higher than that in the comparative example 1. It is considered that this is because the amount of the cooling gas 3a1 supplied to the central region of the substrate 100 is reduced by the dispersion plate 10a as compared with the comparative example 1. Also, in the example 1, it is considered that the cooling gas 3a1 having a lower heat loss is more likely to flow to the outer periphery of the substrate 100 than in the comparative example 1. As a result, it is considered that in the example 1, the temperature of the frozen film was lower from the central region of the substrate 100 to the outer peripheral portion of the substrate 100 than in the comparative Example 1.

The example 1 and the comparative example 2 will now be compared. As shown in FIG. 4, in the example 1, the temperature of the frozen film immediately before thawing is high in the central region of the substrate 100. However, at the substrate middle portion and the substrate outer perimeter portion, the temperature of the frozen film directly before thawing is lower for the example 1 than for the comparative example 2. The dispersion plate 10a is not included in the comparative example 2. Therefore, the cooling gas 3a1 that is supplied from the cooling nozzle 3d directly strikes the back surface 100a of the substrate 100. It is considered that the amount of the cooling gas 3a1 that transfers heat with the substrate 100 is therefore higher at the substrate central portion for the comparative example 2 than for the example 1. It is considered that the temperature of the frozen film at the substrate central portion is therefore lower for the comparative example 2 than for the example 1. However, heat loss occurs for the cooling gas 3a1 that transfers heat with the substrate 100. Also, the cooling gas 3a1 that strikes the back surface 100a of the substrate 100 flows toward the bottom surface of the radially-enlarged portion 3da. Then, the cooling gas 3a1 remains at the radially-enlarged portion 3da. However, it is considered that the heat loss of the remaining cooling gas 3a1 causes the temperature inside the radially-enlarged portion to be greater than that of the example 1. It is considered that the temperature of the frozen film at the substrate middle portion and the substrate outer perimeter portion is therefore higher for the comparative example 2 than for the example 1.

Figure 5:
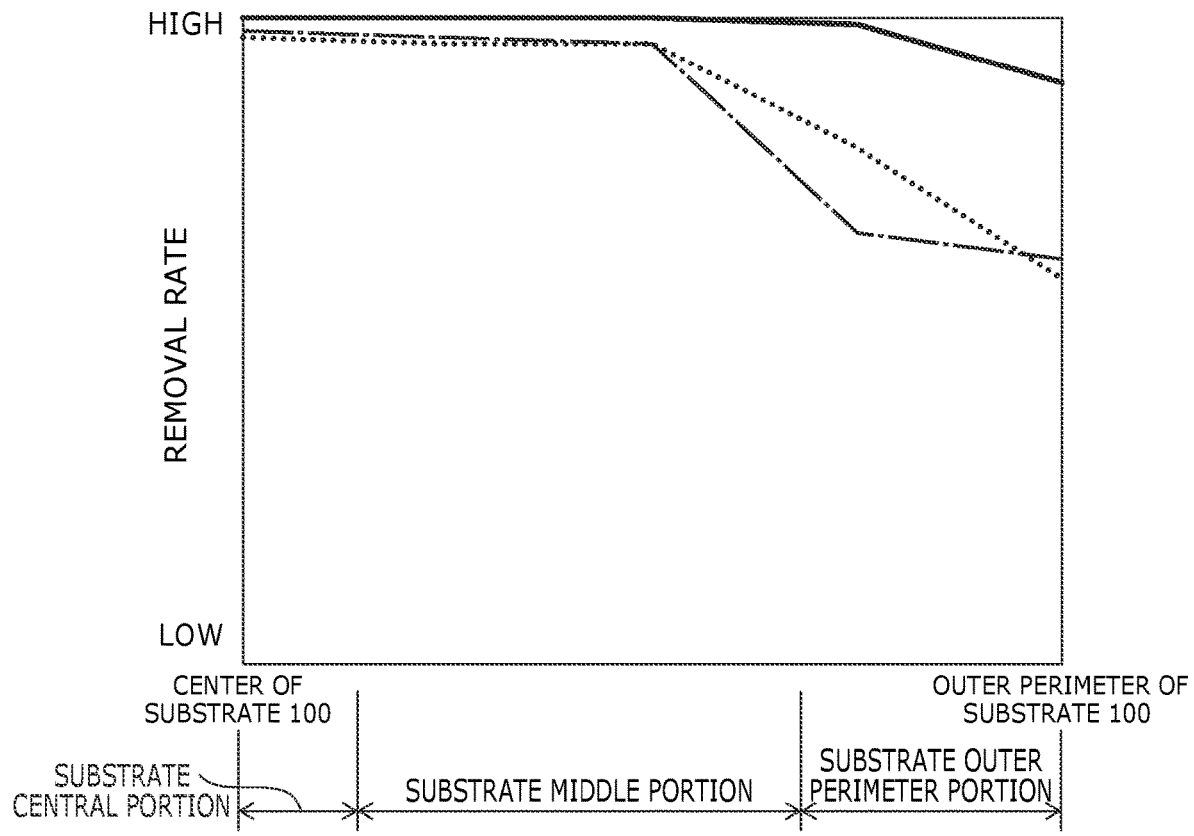
FIG. 5 shows the removal rate from the center to the outer perimeter of the substrate.

FIG. 5 shows the removal rate from the center to the outer perimeter of the substrate 100.

The dotted line shows the distribution of the removal rate of the comparative example 1.

The single dot-dash line shows the distribution of the removal rate of the comparative example 2.

The solid line shows the distribution of the removal rate of the example 1.

As shown in FIG. 5, the example 1 has a high removal rate from the substrate central portion to the substrate outer perimeter portion compared to the comparative examples 1 and 2. In particular, a higher removal rate than those of the comparative examples 1 and 2 is obtained from the substrate middle portion to the substrate outer perimeter portion.

In the example 1, the higher removal rate than that of the comparative example 1 and the comparative example 2 can be obtained from the intermediate region of the substrate 100 to the outer peripheral region of the substrate 100. The reason for this is considered to be that the temperature of the frozen film immediately before thawing at the corresponding region is low. Therefore, in the example 1, fluctuation in the temperature distribution in the surface of the substrate 100 is suppressed as compared with the comparative example 1 and the comparative example 2. Accordingly, in the example 1, it is possible to suppress the fluctuation in the supercooled state of the liquid 101 and the fluctuation in the frozen state of the liquid 101. As a result, it is considered that the removal rate of contaminants has improved.

However, in a conventional cooling gas nozzle that does not include the radially-enlarged portion 3da and the dispersion part 10 (the dispersion plate 10a), the cooling gas 3a1 is discharged from the end portion at the discharge side of the cooling gas nozzle toward the central portion of the back surface 100a of the substrate 100. The cooling gas 3a1 that contacts the central portion of the back surface 100a of the substrate 100 flows through the space between the placement platform 2a and the back surface 100a of the substrate 100 toward the outer perimeter of the substrate 100.

In such a case, the central portion of the back surface 100a of the substrate 100 that is struck by the cooling gas 3a1 is cooled most. In other words, the central portion of the back surface 100a of the substrate 100 is undesirably over-cooled compared to the outer perimeter of the substrate 100. Then, the cooling gas 3a1 that strikes the back surface 100a of the substrate 100 flows toward the outer perimeter of the substrate 100 while transferring heat with the back surface 100a of the substrate 100. Therefore, the temperature of the cooling gas 3a1 undesirably increases toward the outer perimeter of the substrate 100. Accordingly, the temperature of the substrate 100 increases toward the outer perimeter of the substrate 100; and fluctuation of the temperature distribution in the surface of the substrate is formed.

The substrate treatment device 1 according to the embodiment includes the dispersion part 10 (the dispersion plate 10a). The dispersion plate 10a is formed of a material that has a high thermal conductivity and is thinner than the substrate 100. Therefore, the temperature of the dispersion plate 10a in the preliminary process is cooled to be substantially the same temperature as the temperature of the cooling gas 3a1. Accordingly, in the cooling process (supercooling process+freezing process), the heat loss of the cooling gas 3a1 can be reduced even when the cooling gas 3a1 strikes the dispersion plate 10a.

A portion of the cooling gas 3a1 that strikes the dispersion plate 10a flows around the outer perimeter of the dispersion plate 10a and flows toward the back surface 100a of the substrate 100. The heat loss is lower when the cooling gas 3a1 strikes the dispersion plate 10a than when the cooling gas 3a1 strikes the central portion of the back surface 100a of the substrate 100. Therefore, the portion of the cooling gas 3a1 that strikes the dispersion plate 10a reaches the back surface 100a of the substrate 100 that faces the outer perimeter of the dispersion plate 10a with a lower temperature than that of the conventional configuration. Accordingly, the portion of the cooling gas 3a1 that strikes the dispersion plate 10a can better cool the back surface 100a of the substrate 100 that faces the outer perimeter of the dispersion plate 10a.

Here, the dispersion plate 10a is located at the vicinity of the opening of the radially-enlarged portion 3da. Therefore, after the cooling gas 3a1 strikes the dispersion plate 10a, the amount of the cooling gas 3a1 that flows around toward the central portion of the back surface 100a of the substrate 100 can be reduced. Accordingly, the amount of the cooling gas 3a1 that strikes the central portion of the back surface 100a of the substrate 100 can be less than that of a conventional configuration. As a result, the central portion of the substrate 100 can be prevented from being undesirably over-cooled compared to the outer perimeter of the substrate 100.

As described above, the length of the substrate central portion is substantially equal to the radius of the dispersion plate 10a. Accordingly, the portion of the cooling gas 3a1 that strikes the dispersion plate 10a can better cool the vicinity of the boundary between the substrate central portion and the substrate middle portion shown in FIG. 4. As a result, the fluctuation of the temperature distribution in the surface of the substrate can be reduced.

The hole 10aa that is smaller than the hole 3d1 of the cooling nozzle 3d is provided in the center of the dispersion plate 10a. As described above, the dispersion plate 10a can reduce the amount of the cooling gas 3a1 that flows around toward the central portion of the back surface 100a of the substrate 100. If, however, the amount of the cooling gas 3a1 that flows around toward the back surface 100a of the substrate 100 is too low, the temperature of the central portion of the substrate 100 undesirably exceeds the temperature of the outer perimeter of the substrate 100. Therefore, the hole 10aa is provided in the dispersion plate 10a to prevent the temperature of the central portion of the substrate 100 from becoming undesirably greater than the temperature of the outer perimeter of the substrate 100. By providing the hole 10aa in the dispersion plate 10a, the central portion of the back surface 100a of the substrate 100 can be prevented from being over-cooled compared to the outer perimeter of the substrate 100; and the temperature of the central portion of the back surface 100a of the substrate 100 can be prevented from being greater than the temperature of the outer perimeter of the substrate 100. That is, by supplying a small amount of the cooling gas 3a1 to the central portion of the back surface 100a of the substrate 100 via the hole 10aa, the temperature of the central portion of the back surface 100a of the substrate 100 can be cooled to be about equal to the temperature of the outer perimeter of the substrate 100. In particular, it is more favorable for the cross-sectional dimension of the hole 10aa to be not less than 1 mm and not more than 2.5 mm.

The cooling nozzle 3d includes the radially-enlarged portion 3da in the substrate treatment device 1 according to the embodiment. Because the cooling nozzle 3d includes the radially-enlarged portion 3da, the cooling gas 3a1 of which the flow direction is changed by the dispersion plate 10a flows through the interior of the radially-enlarged portion 3da. Then, the cooling gas 3a1 that flows into the interior of the radially-enlarged portion 3da remains inside the radially-enlarged portion 3da. The cooling gas 3a1 that remains inside the radially-enlarged portion 3da cools the cooling gas 3a1 that exists in the space between the placement platform 2a and the back surface 100a of the substrate 100. Accordingly, the cooling gas 3a1 that remains inside the radially-enlarged portion 3da indirectly cools the back surface 100a of the substrate 100.

The cooling gas 3a1 that flows into the interior of the radially-enlarged portion 3da is caused by the dispersion plate 10a to remain inside the radially-enlarged portion 3da at a lower temperature than that of the comparative example 2. As described above, the length of the sum of the substrate central portion and the substrate middle portion is substantially equal to the radius of the radially-enlarged portion 3da of the cooling nozzle 3d. Accordingly, the cooling gas 3a1 that remains inside the radially-enlarged portion 3da can better cool the substrate middle portion of the substrate 100.

The cooling gas 3a1 that remains inside the radially-enlarged portion 3da is discharged from the outer perimeter of the radially-enlarged portion 3da. As described above, the cooling gas 3a1 that flows toward the interior of the radially-enlarged portion 3da remains inside the radially-enlarged portion 3da at a lower temperature than that of the comparative example 2. Therefore, the cooling gas 3a1 that is discharged from the outer perimeter of the radially-enlarged portion 3da has a lower temperature than that of the comparative example 2. Accordingly, the cooling gas 3a1 that is discharged from the outer perimeter of the radially-enlarged portion 3da can better cool the substrate outer perimeter portion of the substrate 100.

The cooling nozzle 3d includes the radially-enlarged portion 3da and the dispersion part 10 (the dispersion plate 10a) in the substrate treatment device 1 according to the embodiment. Therefore, the fluctuation of the temperature distribution in the surface of the substrate 100 can be suppressed. Accordingly, the removal rate of the contaminants can be improved because the fluctuation in the supercooled state of the liquid 101 and the fluctuation in the frozen state of the liquid 101 can be suppressed.

Figure 6:
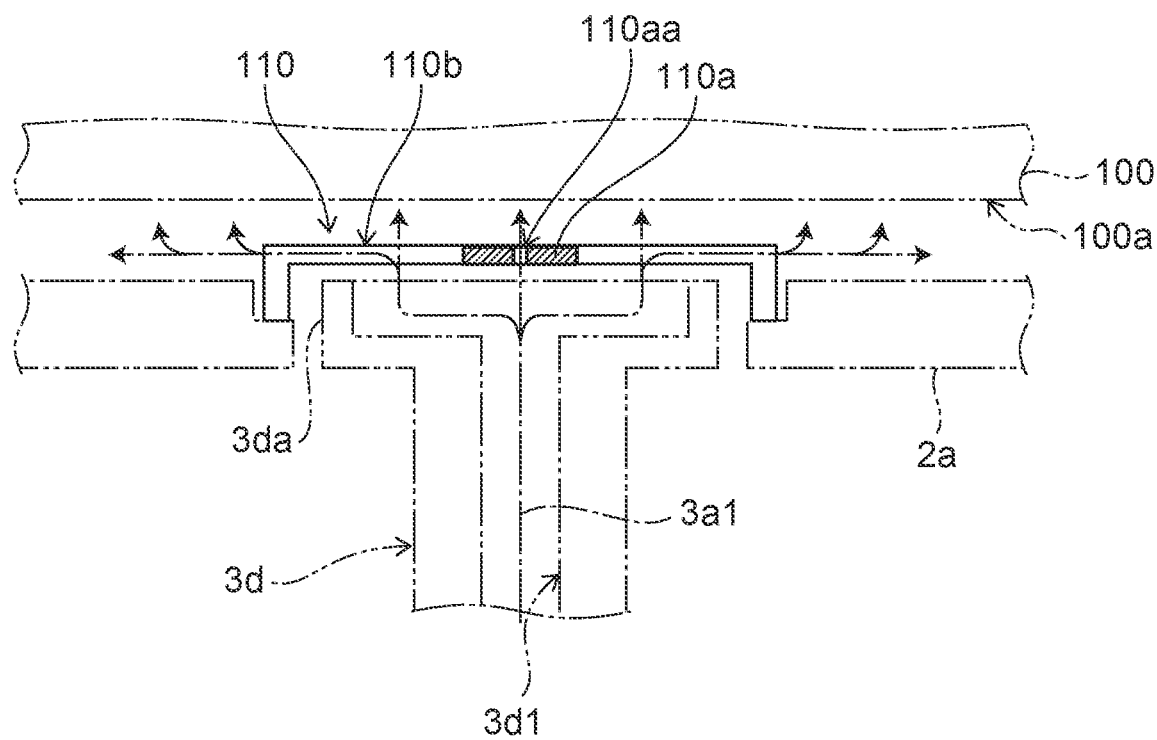
FIG. 6 is a schematic cross-sectional view illustrating a dispersion part according to another embodiment.

FIG. 6 is a schematic cross-sectional view illustrating a dispersion part 110 according to another embodiment.

As shown in FIG. 6, the dispersion part 110 includes, for example, a dispersion plate 110a and a supporter 110b.

In the dispersion part 10 described above, the dispersion plate 10a is located inside the radially-enlarged portion 3da of the cooling nozzle 3d. Conversely, in the dispersion part 110, the dispersion plate 110a is located outside the radially-enlarged portion 3da of the cooling nozzle 3d. The dispersion plate 110a is plate-shaped. The dispersion plate 110a can be located at the vicinity of the opening of the radially-enlarged portion 3da of the cooling nozzle 3d. The central axis of the dispersion plate 110a can be located at a position that overlaps the central axis of the cooling nozzle 3d. In other words, the dispersion plate 110a can be located directly above the hole 3d1 of the cooling nozzle 3d. The surface of the dispersion plate 110a can be orthogonal to the central axis of the cooling nozzle 3d.

The planar shape, the dimensions, etc., of the dispersion plate 110a can be similar to those of the dispersion plate 10a described above.

The dispersion plate 110a includes a hole 110aa that extends through the dispersion plate 110a in the thickness direction. For example, the hole 110aa is located at the central portion of the dispersion plate 110a. The hole 110aa can be similar to the hole 10aa of the dispersion plate 10a described above.

The supporter 110b supports the dispersion plate 110a at a prescribed position outside the radially-enlarged portion 3da of the cooling nozzle 3d. The supporter 110b has a beam-like shape and is located between the side surface of the dispersion plate 110a and the surface of the placement platform 2a at the substrate 100 side. In this case, as shown in FIG. 6, a recess is provided on the surface of the placement platform 2a on the substrate 100 side. The end portion of the supporter 110b on the side opposite to the dispersion plate 110a side may be provided in the recess provided on the surface of the placement platform 2a on the substrate 100 side. For example, the thickness of the supporter 110b can be equal to the thickness of the dispersion plate 110a. It is sufficient for at least one supporter 110b to be included. However, the position and the orientation of the dispersion plate 110a can be stabilized by including multiple supporters 110b.

As shown in FIG. 6, the flow direction of the cooling gas 3a1 that flows through the interior of the hole 3d1 of the cooling nozzle 3d is changed by striking the dispersion plate 110a. At this time, a portion of the cooling gas 3a1 that strikes the dispersion plate 110a is supplied to the back surface 100a of the substrate 100 via the hole 110aa of the dispersion plate 110a. The cooling gas 3a1 of which the flow direction is changed by the dispersion plate 110a flows through the interior of the radially-enlarged portion 3da and is discharged through the opening of the radially-enlarged portion 3da. Also, a portion of the cooling gas 3a1 can remain inside the radially-enlarged portion 3da.

After striking the dispersion part 110, the cooling gas 3a1 that is discharged through the opening of the radially-enlarged portion 3da flows through the space between the placement platform 2a and the back surface 100a of the substrate 100 and is supplied to the back surface 100a of the substrate 100.

Effects similar to those of the dispersion part 10 (the dispersion plate 10a) described above can be provided by including the dispersion part 110 (the dispersion plate 110a). The dispersion part 110 is located outside the radially-enlarged portion 3da of the cooling nozzle 3d. Therefore, the distance between the dispersion part 110 and the back surface 100a of the substrate 100 is short. Accordingly, the amount of the cooling gas 3a1 that flows around toward the central portion of the back surface 100a of the substrate 100 can be further reduced. Therefore, this configuration is effective in cases where the central portion of the substrate 100 is undesirably over-cooled compared to the outer perimeter of the substrate 100. In other words, the fluctuation of the temperature distribution in the surface of the substrate 100 can be suppressed.

The dispersion part 110 is connected to the surface of the placement platform 2a at the substrate 100 side via the supporter 110b. Therefore, the dispersion part 110 can be rotated with the placement platform 2a. The cooling gas 3a1 rotates with the dispersion part 110 by striking the rotating dispersion part 110. That is, the cooling gas 3a1 receives rotational energy from the dispersion part 110. Therefore, the cooling gas 3a1 flows better toward the outer perimeter of the substrate 100. Accordingly, the vicinity of the boundary between the substrate central portion and the substrate middle portion can be better cooled. As a result, the fluctuation of the temperature distribution in the surface of the substrate can be reduced.

Therefore, the removal rate of the contaminants in the entire region of the substrate 100 can be improved because the fluctuation of the removal rate of the contaminants between the regions of the substrate 100 in the cooling process (supercooling process+freezing process) described above can be suppressed.

Figure 7:
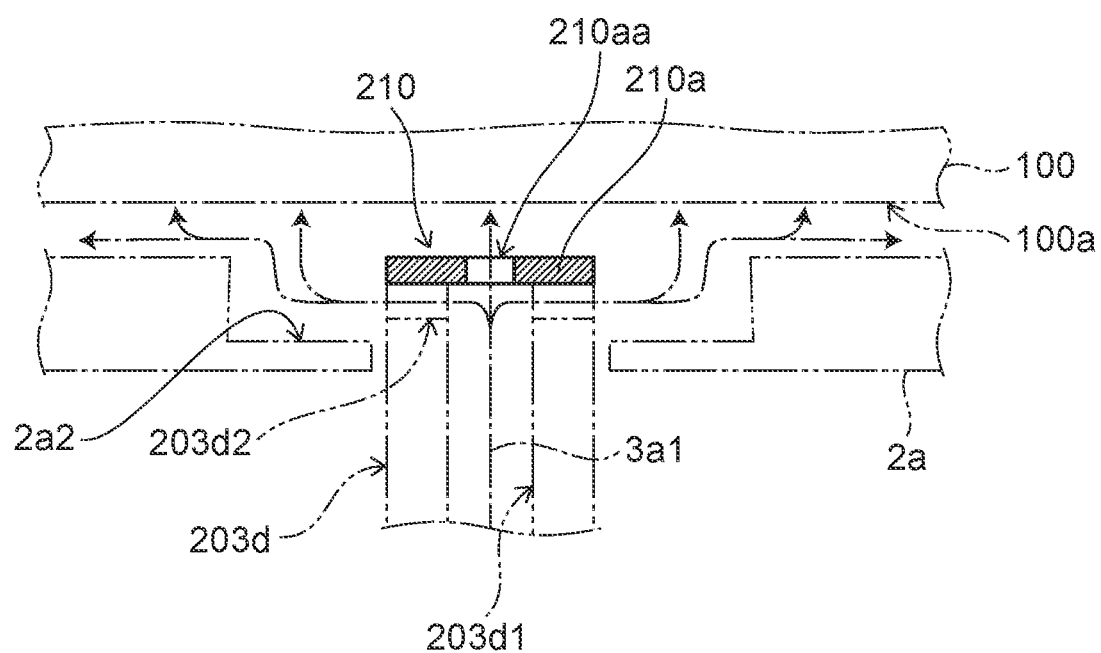
FIG. 7 is a schematic cross-sectional view illustrating a dispersion part according to another embodiment.

FIG. 7 is a schematic cross-sectional view illustrating a dispersion part 210 according to another embodiment.

As shown in FIG. 7, the dispersion part 210 includes, for example, a dispersion plate 210a.

In the dispersion part 10 described above, the dispersion plate 10a is located inside the radially-enlarged portion 3da of the cooling nozzle 3d. Conversely, the dispersion plate 210a is located at the tip of a cooling nozzle 203d that does not include a radially-enlarged portion. The dispersion plate 210a is located at the end portion of the cooling nozzle 203d at the discharge side of the cooling gas 3a1. In other words, the dispersion part 210 does not include the supporter that supports the dispersion plate 210a.

The dispersion plate 210a is plate-shaped. The central axis of the dispersion plate 210a can be located at a position overlapping the central axis of the cooling nozzle 203d. In other words, the dispersion plate 210a can be located directly above a hole 203d1 (corresponding to an example of the second hole) extending through the interior of the cooling nozzle 203d. The surface of the dispersion plate 210a can be orthogonal to the central axis of the cooling nozzle 203d.

The planar shape, the dimensions, etc., of the dispersion plate 210a can be similar to those of the dispersion plate 10a described above.

The dispersion plate 210a includes a hole 210aa that extends through the dispersion plate 210a in the thickness direction. For example, the hole 210aa is located at the central portion of the dispersion plate 210a. The hole 210aa can be similar to the hole 10aa of the dispersion plate 10a described above.

Multiple hole 203d2 (corresponding to an example of the third hole) are located at the vicinity of the end portion of the cooling nozzle 203d at which the dispersion plate 210a is located. The hole 203d2 extends between the hole 203d1 and the side surface of the cooling nozzle 203d.

A recess 2a2 is provided in the surface of the placement platform 2a at the substrate 100 side. The exterior form of the recess 2a2 is, for example, circular or rectangular. It is favorable for the exterior form of the recess 2a2 to be smaller than the exterior form of the substrate 100. The dispersion plate 210a and the portion of the cooling nozzle 203d in which the multiple holes 203d2 are provided are located inside the recess 2a2. That is, the recess 2a2 is included instead of the radially-enlarged portion 3da.

As shown in FIG. 7, the flow direction of the cooling gas 3a1 that flows through the interior of the hole 203d1 of the cooling nozzle 203d is changed by striking the dispersion plate 210a. At this time, a portion of the cooling gas 3a1 that strikes the dispersion plate 210a is supplied to the back surface 100a of the substrate 100 via the hole 210aa of the dispersion plate 210a. The cooling gas 3a1 of which the flow direction is changed by the dispersion plate 210a is supplied to the interior of the recess 2a2 via the multiple holes 203d2. The cooling gas 3a1 that is supplied to the interior of the recess 2a2 flows through the interior of the recess 2a2 and is discharged through the opening of the recess 2a2. Also, a portion of the cooling gas 3a1 can remain inside the recess 2a2.

The cooling gas 3a1 that is discharged through the opening of the recess 2a2 flows through the space between the placement platform 2a and the back surface 100a of the substrate 100 and is supplied to the back surface 100a of the substrate 100.

By including the dispersion part 210 (the dispersion plate 210a), effects similar to those of the dispersion part 10 (the dispersion plate 10a) described above can be provided. Namely, the fluctuation of the temperature distribution in the surface of the substrate 100 can be suppressed. Therefore, the removal rate of the contaminants in the entire region of the substrate 100 can be improved because the fluctuation of the removal rate of the contaminants between the regions of the substrate 100 in the cooling process (supercooling process+freezing process) described above can be suppressed.

In particular, it is more favorable for the exterior form of the recess 2a2 to have a shape similar to or substantially smaller than the substrate 100. Thereby, even when the substrate 100 is substantially quadrilateral, the cooling gas 3a1 can remain at the four corners of the substrate 100. The recess 2a2 can be rotated with the substrate 100. Therefore, the four corners of the substrate 100 are constantly cooled by the cooling gas 3a1 remaining at the four corners of the substrate 100. In such a case, it is favorable for the recess 2a2 to be 5 mm to 10 mm smaller than the substrate 100.

Figure 8A:
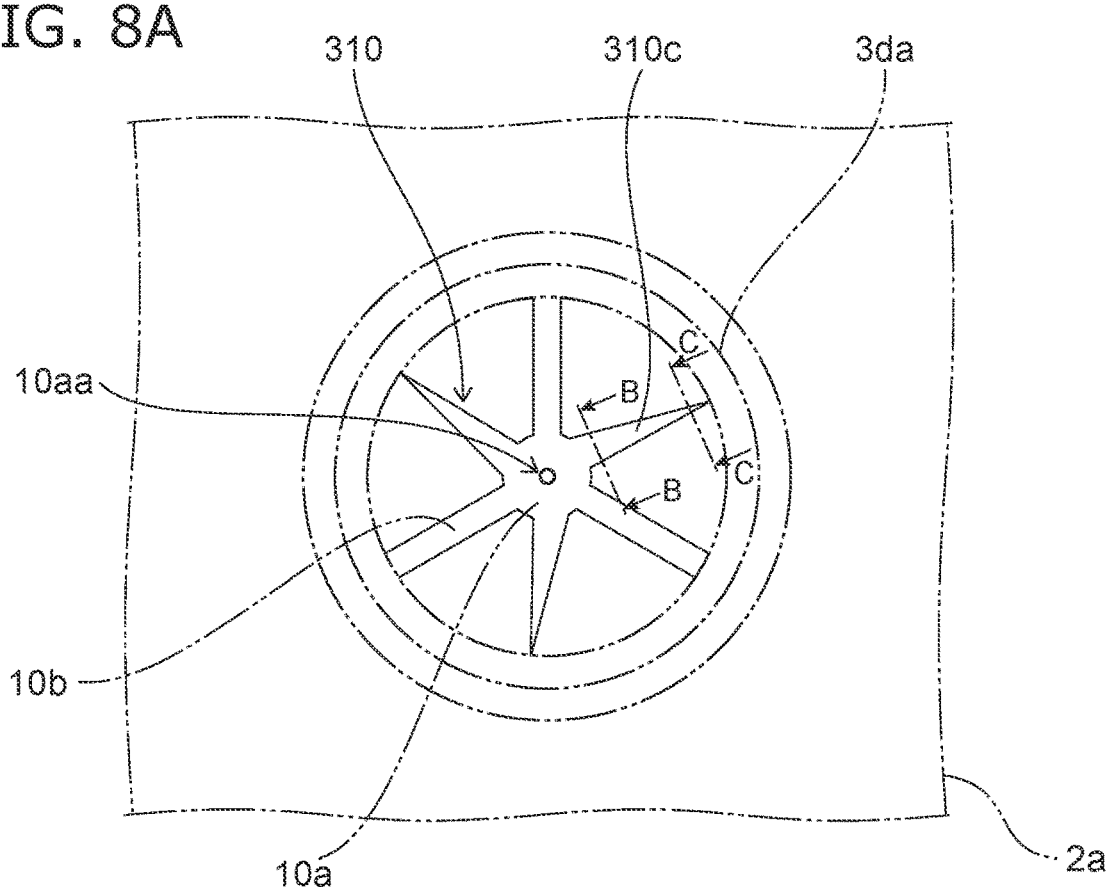
FIG. 8A is a schematic view illustrating a dispersion part according to another embodiment.

FIG. 8A is a schematic view illustrating a dispersion part 310 according to another embodiment.

Figure 8B:
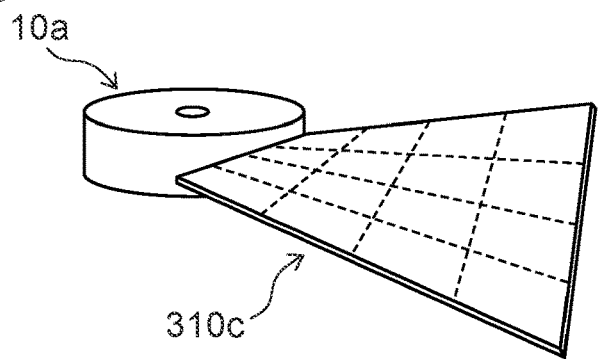
FIG. 8B is a perspective view illustrating a vane.

FIG. 8B is a perspective view illustrating a vane 310c.

Figure 8C:
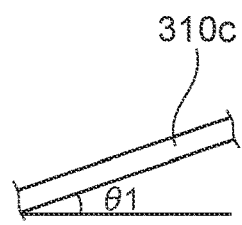
FIG. 8C is a line B-B cross-sectional view of the dispersion part of FIG. 8A.

FIG. 8C is a line B-B cross-sectional view of the dispersion part 310 of FIG. 8A.

Figure 8D:
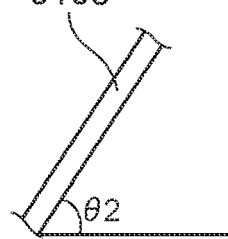
FIG. 8D is a line C-C cross-sectional view of the dispersion part of FIG. 8A.

FIG. 8D is a line C-C cross-sectional view of the dispersion part 310 of FIG. 8A.

As shown in FIG. 8A, the dispersion part 310 includes, for example, the dispersion plate 10a, the supporter 10b, and the vane 310c. In other words, the dispersion part 310 includes the vane 310c added to the dispersion part 10 described above.

The vane 310c can be located between the supporter 10b and the supporter 10b. The vane 310c is plate-shaped; one end portion of the vane 310c is connected to the dispersion plate 10a; and the other end portion of the vane 310c is connected to the inner wall of the radially-enlarged portion 3da of the cooling nozzle 3d.

As shown in FIG. 8B, the vane 310c has a twisted configuration in which the tilt angle increases from one end portion toward the other end portion. For example, as shown in FIGS. 8C and 8D, a tilt angle θ2 of the vane 310c at the radially-enlarged portion 3da side can be greater than a tilt angle θ1 of the vane 310c at the dispersion plate 10a side. For example, the tilt angle θ1 can be about 10°; and the tilt angle θ2 can be about 60°.

By including such a vane 310c, the cooling gas 3a1 can be guided along the vane 310c toward the outer perimeter of the substrate 100 after striking the dispersion part 310.

Although the vane 310c is illustrated as being included in the dispersion plate 10a, the vane 310c also can be included in the dispersion plate 110a illustrated in FIG. 6. As in the supporter 110b, one end portion of the vane 310c is connected to the side surface of the dispersion plate 110a; and the other end portion of the vane 310c is connected to the surface of the placement platform 2a at the substrate 100 side. Thereby, the vane 310c can be rotated with the placement platform 2a. For example, when the vane 310c is included in the dispersion plate 110a as shown in FIG. 8B, the vane 310c can guide the cooling gas 3a1 better toward the substrate side by the controller 11 rotating the placement platform 2a clockwise. That is, the cooling gas 3a1 can be guided better toward the substrate side by rotating the vane 310c in the direction in which the vane 310c faces downward.

The vane 310c also can be included in the dispersion plate 210a illustrated in FIG. 7. When the dispersion plate 210a includes the vane 310c, only one end portion of the vane 310c is connected to the dispersion plate 210a. In such a case, the cooling gas 3a1 can be guided along the vane 310c toward the outer perimeter of the substrate 100 after striking the dispersion part 310.

Or, only one end portion of the vane 310c is connected to the inner wall of the recess 2a2 that is provided in the placement platform 2a. In such a case, the controller 11 guides the cooling gas 3a1 that flows through the interior of the recess 2a2 toward the substrate 100 side by rotating the vane 310c in the direction in which the vane 310c faces downward.

Figure 9:
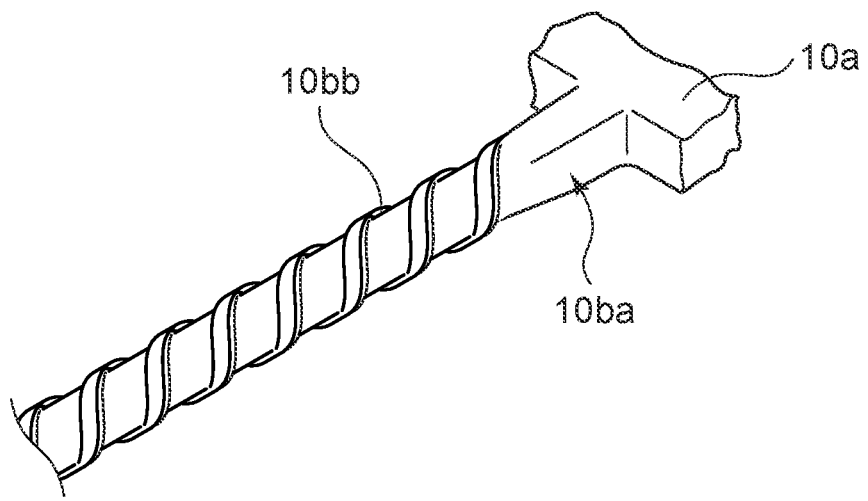
FIG. 9 is a schematic perspective view illustrating a supporter according to another embodiment.

FIG. 9 is a schematic perspective view illustrating a supporter 10ba according to another embodiment.

For example, similarly to the supporter 10b, the supporter 10ba has a beam-like shape and is located between the side surface of the dispersion plate 10a and the inner wall of the radially-enlarged portion 3da of the cooling nozzle 3d.

As shown in FIG. 9, for example, the supporter 10ba can be formed by providing a spiral recess 10bb in the side surface of the supporter 10b. By providing the spiral recess 10bb in the side surface of the supporter 10ba, the cooling gas 3a1 that contacts the spiral recess 10bb can flow in a spiral direction. Therefore, compared to the supporter 10b that does not include the spiral recess 10bb, the cooling gas 3a1 that flows toward the back surface 100a of the substrate 100 can be increased.

The spiral recess 10bb may be provided in the side surface of the supporter 110b (see FIG. 9). In particular, it is favorable to provide the spiral recess 10bb in the side surface of a portion of the supporter 110b that is parallel to the horizontal direction. The supporter 110b rotates as the placement platform 2a rotates. The cooling gas 3a1 that contacts the spiral recess 10bb can better flow in a spiral direction. As a result, the cooling gas 3a1 that flows toward the back surface 100a of the substrate 100 can be increased.

Figure 10:
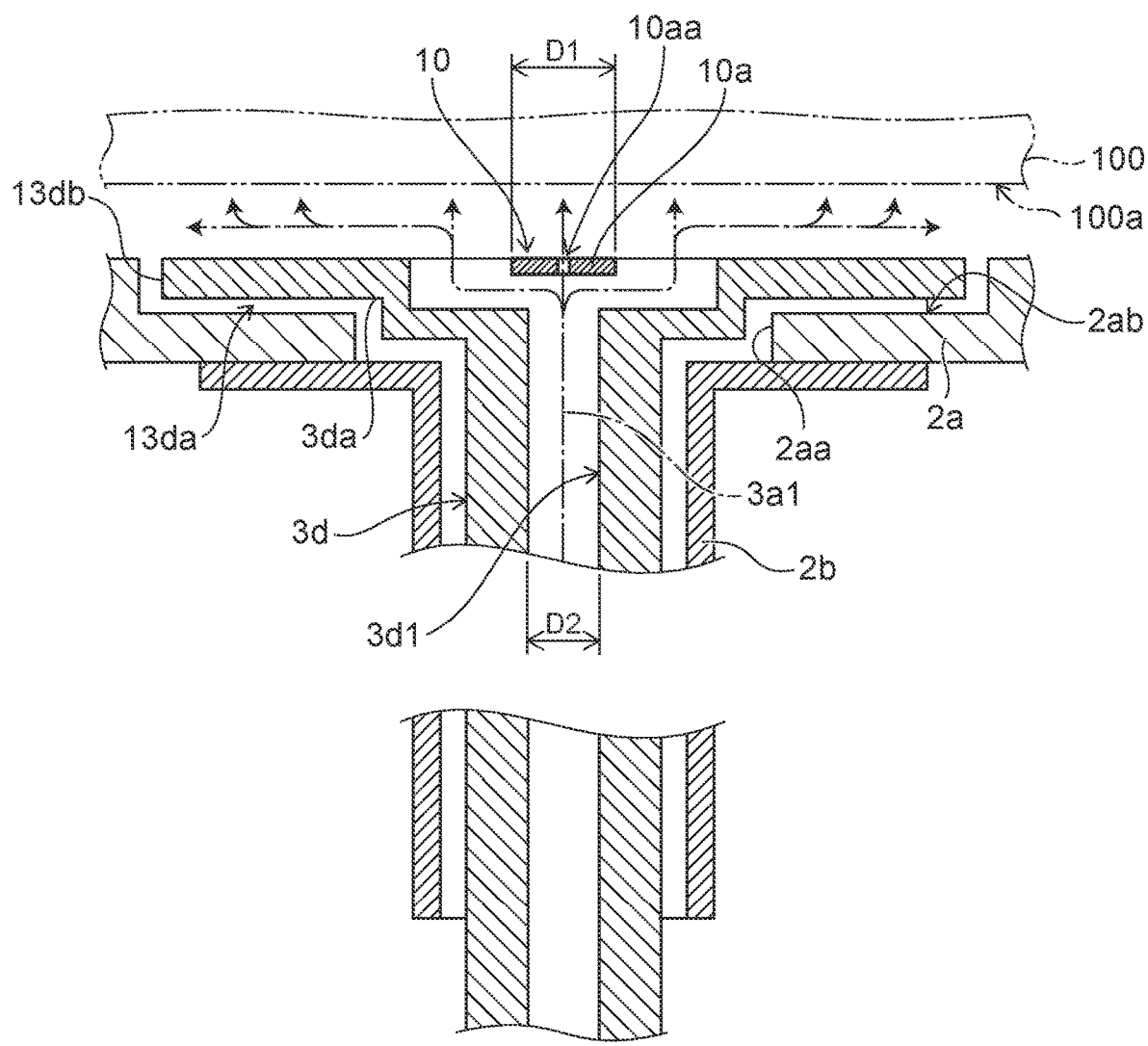
FIG. 10 is a schematic cross-sectional view illustrating a radially-enlarged portion according to another embodiment.

FIG. 10 is a schematic cross-sectional view illustrating a radially-enlarged portion 13da according to another embodiment.

The embodiment is similar to the embodiments described above in that the cooling nozzle 3d is fixed (non-rotatable), but differs from the embodiments described above in that a gap is formed between the cooling nozzle 3d and the rotary shaft 2b and a sealing member such as a rotary shaft seal or the like does not exist. In such a configuration, the sealing member is unnecessary, but the cooling gas 3a1 that is supplied to the space between the placement platform 2a and the back surface 100a of the substrate 100 easily passes through the gap and leaks outside the housing 6.

To prevent the leak, the radially-enlarged portion 13da can include a flange 13db at the side surface of the radially-enlarged portion 3da described above as shown in FIG. 10. The flange 13db is plate-shaped. The upper surface of the flange 13db can be coplanar with the upper surface of the radially-enlarged portion 3da.

Also, a recess 2ab can be provided in the surface of the placement platform 2a at the substrate 100 side at the peripheral edge of the hole 2aa of the placement platform 2a. The flange 13db is located inside the recess 2ab with a gap interposed between the flange 13db and the recess 2ab. In other words, a gap is located between the bottom surface of the recess 2ab and the back surface of the flange 13db (the surface at the side of the bottom surface of the recess 2ab). Also, a gap is located between the side surface of the flange 13db and the side surface of the recess 2ab. Therefore, the rotating placement platform 2a and the non-rotating flange 13db are not in contact. The length of the gap located between the flange 13db and the inner wall of the recess 2ab is the length along the inner wall of the recess 2ab.

Here, the length of the gap located between the flange 13db and the inner wall of the recess 2ab is greater than the length of the gap formed between the radially-enlarged portion 3da and the hole 2aa (see FIG. 2B). Therefore, the flow path resistance of the gap located between the flange 13db and the inner wall of the recess 2ab is greater than the flow path resistance of the gap formed between the radially-enlarged portion 3da and the hole 2aa. Accordingly, leakage via the gap of the cooling gas 3a1 supplied to the space between the placement platform 2a and the back surface 100a of the substrate 100 can be suppressed. Also, the penetration of the external air via the gap into the space between the placement platform 2a and the back surface 100a of the substrate 100 can be suppressed. Accordingly, the cooling efficiency can be increased.

The length of the gap formed between the radially-enlarged portion 3da and the hole 2aa decreases as the length of the rotary shaft 2b decreases. Therefore, the radially-enlarged portion 13da according to the embodiment is favorable when there is a gap between the cooling nozzle 3d and the rotary shaft 2b and the rotary shaft 2b is short.

Figure 11:
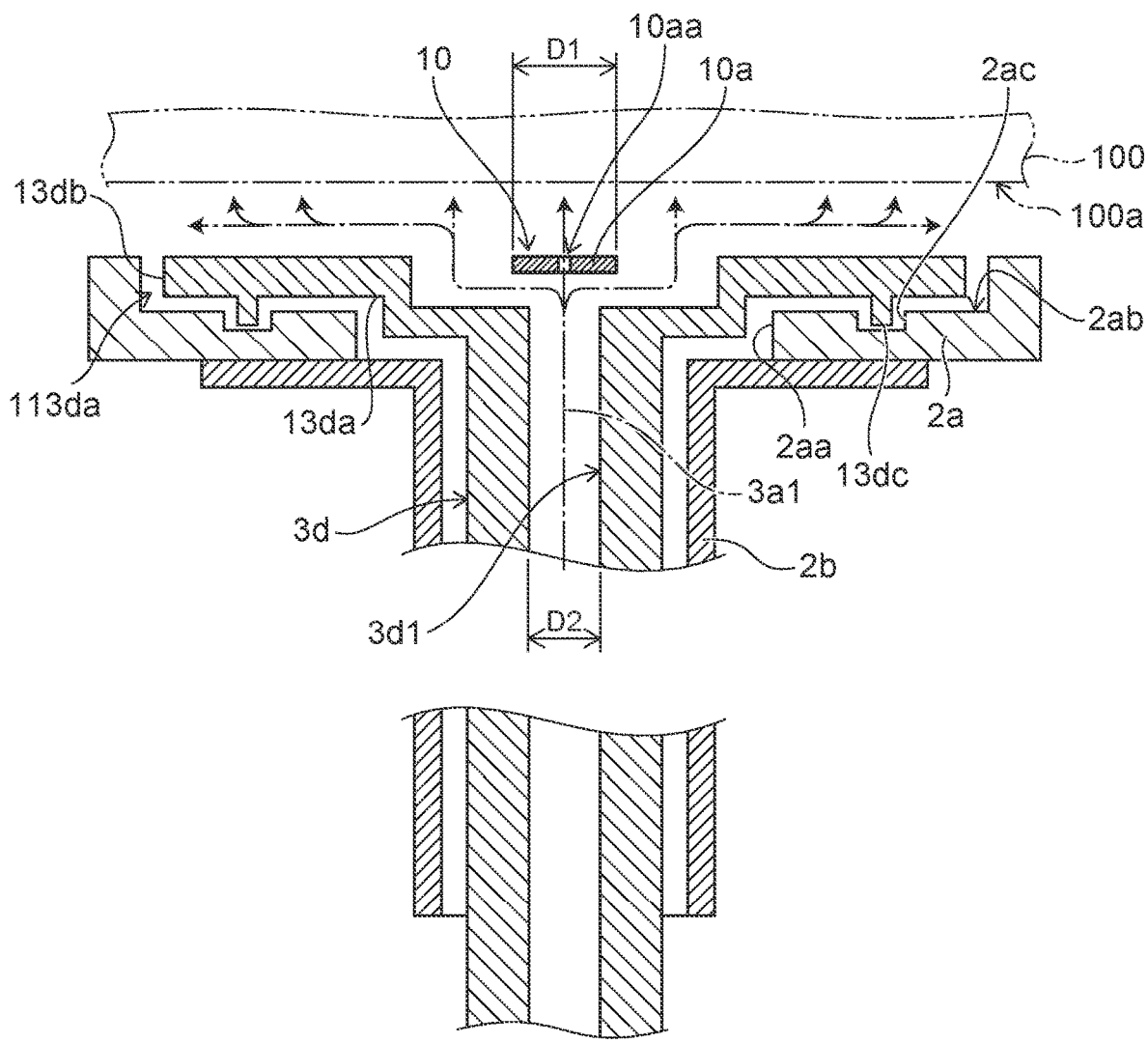
FIG. 11 is a schematic cross-sectional view illustrating a radially-enlarged portion according to another embodiment.

FIG. 11 is a schematic cross-sectional view illustrating a radially-enlarged portion 113da according to another embodiment.

As shown in FIG. 11, the radially-enlarged portion 113da further includes a ring-shaped protrusion 13dc in the back surface of the flange 13db described above (the surface at the side of the bottom surface of the recess 2ab). A ring-shaped recess 2ac is provided in the bottom surface of the recess 2ab at a position of the bottom surface of the recess 2ab facing the protrusion 13dc. The protrusion 13dc is located inside the recess 2ac with a gap interposed between the protrusion 13dc and the recess 2ac. Therefore, the rotating placement platform 2a and the flange 13db and the protrusion 13dc that do not rotate are not in contact. By including the protrusion 13dc and the recess 2ac, the flow path resistance of the gap located between the flange 13db and the inner wall of the recess 2ab can be further increased. Therefore, the leakage via the gap of the cooling gas 3a1 supplied to the space between the placement platform 2a and the back surface 100a of the substrate 100 can be further suppressed. Also, the penetration via the gap of the external air into the space between the placement platform 2a and the back surface 100a of the substrate 100 can be further suppressed. Accordingly, the cooling efficiency can be further increased.

Figure 12:
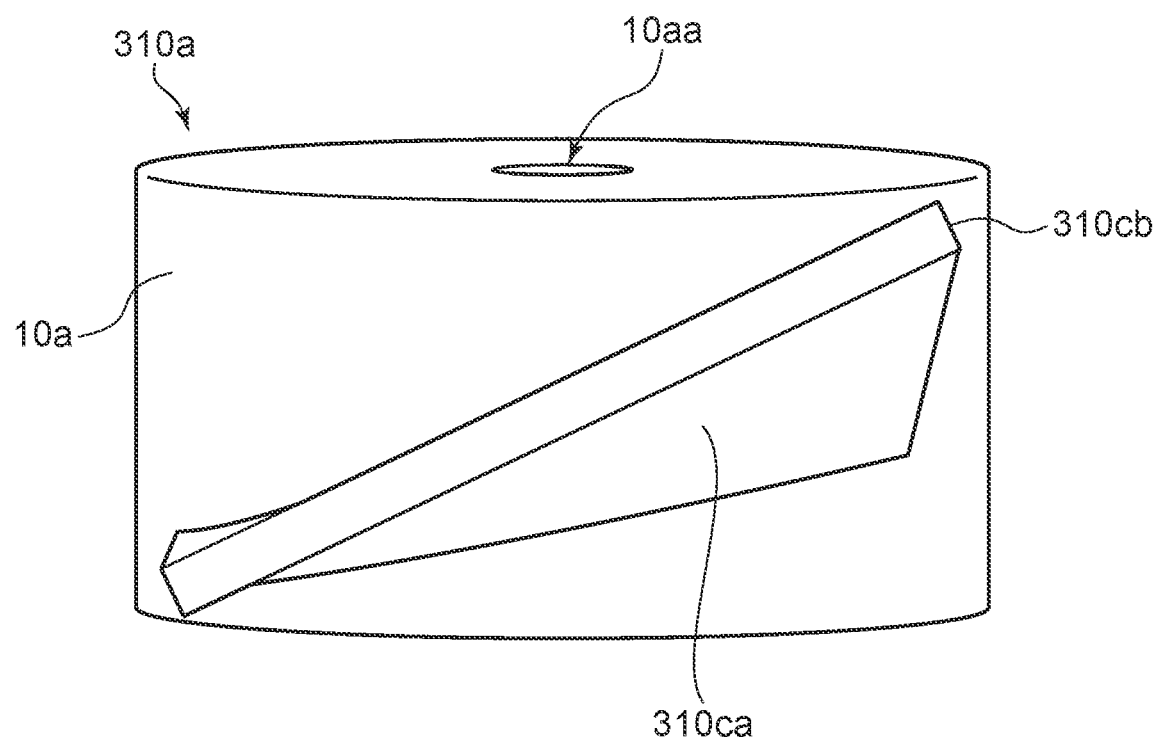
FIG. 12 is a schematic perspective view illustrating another embodiment of a vane included in the dispersion part.

FIG. 12 is a schematic perspective view illustrating another embodiment of a vane 310ca included in a dispersion part 310a.

Similarly to the vane 310c illustrated in FIG. 8A, the vane 310ca can be located between the supporter 10b and the supporter 10b. The vane 310ca is plate-shaped; one end portion of the vane 310ca is connected to the dispersion plate 10a; and another end portion of the vane 310ca is connected to the inner wall of the radially-enlarged portion 3da of the cooling nozzle 3d.

As shown in FIG. 12, the vane 310ca has a twisted configuration in which the tilt angle increases from the one end portion toward the other end portion. The twisted configuration can be similar to the vane 310c illustrated in FIG. 8B. The number, the arrangement, and the tilt angle of the vane 310ca can be similar to those of the vane 310c.

However, an upper end 310cb of the vane 310ca is positioned lower than the upper surface of the dispersion plate 10a. Thus, the flow of the cooling gas 3a1 that flows along the upper surface of the dispersion plate 10a is not disturbed by the upper end 310cb of the vane 310ca.

Because the upper end 310cb of the vane 310ca is positioned lower than the upper surface of the dispersion plate 10a, it is favorable for the one end portion of the vane 310ca connected to the dispersion plate 10a to be mounted obliquely with respect to the side surface of the dispersion plate 10a. In such a case, it is favorable for the tilt angle when mounting to be less than 10°.

Hereinabove, exemplary embodiments of the invention are described with reference to specific examples. However, the invention is not limited to these specific examples. Additions, deletions, or design modifications of components or additions, omissions, or condition modifications of processes made appropriately by one skilled in the art for embodiments described above are within the scope of the invention to the extent that the features of the invention are included.

For example, the shapes, dimensions, numbers, arrangements, etc., of the components included in the substrate treatment device 1 are not limited to those illustrated and can be modified as appropriate.

What is claimed is:

1. A substrate treatment device, comprising:
   a placement part including a placement platform, a substrate being placeable on the placement platform, the placement part being configured to rotate the placed substrate;
   a cooling nozzle configured to supply a cooling gas to a space between the placement platform and the substrate;
   a liquid supplier configured to supply a liquid to a surface of the substrate opposite to the placement platform side; and
   a dispersion plate located at a discharge side of the cooling gas of the cooling nozzle,
   the dispersion plate including a first hole extending through the dispersion plate in a thickness direction,
   the first hole being located at a position overlapping a central axis of the cooling nozzle when viewed along a direction along the central axis of the cooling nozzle.

2. The device according to claim 1, wherein
   the cooling nozzle includes a radially-enlarged portion located at an end portion of the cooling nozzle at the discharge side of the cooling gas, and the dispersion plate is located inside the radially-enlarged portion.

3. The device according to claim 1, wherein a surface of the placement platform at the substrate side and a surface of the dispersion plate at the substrate side are at a same position in the direction along the central axis of the cooling nozzle.

4. The device according to claim 1, wherein the cooling nozzle includes a radially-enlarged portion located at an end portion of the cooling nozzle at the discharge side of the cooling gas, and the dispersion plate is located outside the radially-enlarged portion.

5. The device according to claim 1, wherein the dispersion plate is located at an end portion of the cooling nozzle at the discharge side of the cooling gas, the cooling nozzle includes a third hole at a vicinity of the end portion at which the dispersion plate is located, the third hole extends between a side surface of the cooling nozzle and a second hole of the cooling nozzle, the second hole extends through an interior of the cooling nozzle, a recess is provided in a surface of the placement platform at the substrate side, the dispersion plate is located inside the recess, and a portion of the cooling nozzle is located inside the recess and includes the third hole.

6. The device according to claim 1, wherein a cross-sectional dimension of the first hole is not less than 1 mm and not more than 2.5 mm.

7. The device according to claim 2, further comprising: a vane that guides the cooling gas flowing inside the radially-enlarged portion to the substrate side, one end portion of the vane being connected to the dispersion plate.

8. The device according to claim 5, further comprising: a vane that guides, to the substrate side, the cooling gas flowing inside the recess provided in the placement platform, one end portion of the vane being connected to the dispersion plate.

9. The device according to claim 1, further comprising: a flange located at a side surface of the radially-enlarged portion, the flange being plate-shaped, a recess being provided in a surface of the placement platform at the substrate side, the flange being located inside the recess with a gap interposed between the flange and the recess.

10. The device according to claim 9, wherein a ring-shaped protrusion is located at a surface of the flange at a bottom surface side of the recess, a ring-shaped recess is provided in the bottom surface of the recess at a position of the bottom surface of the recess facing the ring-shaped protrusion, and the ring-shaped protrusion is located inside the ring-shaped recess with a gap interposed between the ring-shaped protrusion and the ring-shaped recess.

11. The device according to claim 2, further comprising: a supporter having a beam-like shape, one end portion being connected to the dispersion plate, a spiral recess being formed in a side surface of the supporter.

12. The device according to claim 11, wherein the dispersion plate and the supporter are formed to have a continuous body.

13. The device according to claim 1, wherein a thickness of the dispersion plate is less than a thickness of the substrate.

14. The device according to claim 1, wherein a surface of the dispersion plate is orthogonal to the central axis of the cooling nozzle.

15. The device according to claim 1, wherein a planar shape of the dispersion plate is circular.

16. The device according to claim 1, wherein a planar dimension of the dispersion plate is greater than a cross-sectional dimension of a second hole extending through an interior of the cooling nozzle.

17. The device according to claim 1, wherein a cross-sectional dimension of the first hole is less than a cross-sectional dimension of a second hole extending through an interior of the cooling nozzle.

18. The device according to claim 1, wherein the first hole is located in a central portion of the dispersion plate.

19. The device according to claim 1, further comprising: a vane located between a side surface of the dispersion plate and an inner wall of the radially-enlarged portion.

20. The device according to claim 1, wherein the dispersion plate includes a metal.

* * * * *